(12) United States Patent
Yoder

(10) Patent No.: US 8,655,797 B2
(45) Date of Patent: Feb. 18, 2014

(54) SYSTEMS AND METHODS FOR BRAIN-LIKE INFORMATION PROCESSING

(76) Inventor: Lane D. Yoder, Kaneohe, HI (US)

( * ) Notice: Subject to any disclaimer, the term of this patent is extended or adjusted under 35 U.S.C. 154(b) by 485 days.

(21) Appl. No.: 12/968,154

(22) Filed: Dec. 14, 2010

(65) Prior Publication Data

US 2011/0140736 A1    Jun. 16, 2011

Related U.S. Application Data

(60) Provisional application No. 61/286,244, filed on Dec. 14, 2009.

(51) Int. Cl.
*G06N 5/00* (2006.01)
*G06F 1/00* (2006.01)

(52) U.S. Cl.
USPC .................................. 706/1; 714/40; 716/107

(58) Field of Classification Search
USPC ........................................... 714/40; 716/107
See application file for complete search history.

(56) References Cited

U.S. PATENT DOCUMENTS

| | | | |
|---|---|---|---|
| 5,046,019 A | 9/1991 | Basehore | |
| 5,201,026 A | 4/1993 | Tsuiki | |
| 5,484,968 A | 1/1996 | Nakamura | |
| 5,566,983 A | 10/1996 | Gluys et al. | |
| 5,594,835 A | 1/1997 | Rahman et al. | |
| 5,606,646 A | 2/1997 | Khan et al. | |
| 5,648,627 A | 7/1997 | Usa | |
| 5,943,659 A | 8/1999 | Giles et al. | |
| 6,456,990 B1 | 9/2002 | Hoffmann et al. | |
| 6,496,813 B1 | 12/2002 | Labreche et al. | |
| 6,507,828 B1 | 1/2003 | Leonard et al. | |
| 7,086,016 B2* | 8/2006 | Matsuzaki et al. | 716/107 |
| 7,139,740 B2 | 11/2006 | Ayala | |
| 7,202,794 B2 | 4/2007 | Huseynov et al. | |
| 7,302,089 B1 | 11/2007 | Smits | |
| 2006/0079778 A1 | 4/2006 | Mo et al. | |
| 2010/0332909 A1* | 12/2010 | Larson | 714/40 |

FOREIGN PATENT DOCUMENTS

EP    1598012 B1    6/2007

OTHER PUBLICATIONS

Lane Yoder; "Relative Absorption Model of Color Vision"; Aug. 2005; Wiley Periodicals, Inc.; Color research and application, vol. 30, No. 4; 13 pp.
Lane Yoder; "Explicit Logic Circuits Discriminate Neural States"; Jan. 2009; PLoS ONE; vol. 4, Issue 1; Honolulu, USA.

(Continued)

*Primary Examiner* — Kakali Chaki
*Assistant Examiner* — Kalpana Bharadwaj

(57) ABSTRACT

Logic circuits provide networks to simulate the functions of neural networks of the brain, and can discriminate degrees of state, and combinations of degrees of state, corresponding to a number of neurons. Logic circuits comprise Recursive AND NOT Conjunctions (RANCs), or AND NOT gates. A RANC is a general logic circuit that performs conjunctions for $2^n$ possible combinations of truth values of n propositions. The RANCs function dynamically, with capabilities of excitation and inhibition. Networks of RANCs are capable of subserving a variety of brain functions, including creative and analytical thought processes. A complete n-RANC produces all conjunctions corresponding to the $2^n$ possible combinations of truth values of n propositions.

20 Claims, 12 Drawing Sheets

(56) References Cited

OTHER PUBLICATIONS

Lane Yoder; "Explicit Logic Circuits Predict Local Properties of the Neocortex's Physiology and Anatomy"; Feb. 2010; 16 pp.; PLoS ONE; vol. 5, Issue 2; Honolulu, USA.

M.A. Reyes-Barranca and A. Medina-Santiago; "Methodology for the design of a 4-bit soft-hardware-logic circuit based on neuron MOS transistors"; Jun. 2008; International Journal of Electronics, vol. 95, No. 6; 15 pp.

Tatsumi Hisayuki, Tokumasu Shinji; "A Simulation of Logic Diagnosis Algorithm based on Artificial Neural Network" Abstract; 2000; Shimyureshon. Tekunoroji. Konfarensu Happyo Ronbunshu, vol. 19.

J. Lewis Lin; "Fuzzy controller for flexible-link robot arm by reduced-order techniques" Abstract; May 2002; IEEE Xplore, vol. 149, Issue 3.

D.A. Linkens; "Learning systems in intelligent control: an appraisal of fuzzy, neural and genetic algorithm control applications" Abstract; Jul. 1996; IEEE Xplore, vol. 143, Issue 4.

\* cited by examiner

SYSTEMS AND METHODS FOR BRAIN-LIKE INFORMATION PROCESSING

CROSS-REFERENCE TO RELATED APPLICATIONS

This application claims priority to U.S. Provisional Patent Application No. 61/286,244, filed on Dec. 14, 2009, entitled "Systems and Methods for Discriminating Neural States," the entire disclosure of which is incorporated herein by reference.

FIELD

The present disclosure is directed to discrimination of neural states and, more specifically, to logic circuits that emulate the brain's neural networks.

BACKGROUND

The relationship between the organization of synaptic connections and how the brain processes information has traditionally been poorly understood. For some reflex responses the connectivity has been discovered by direct observation, and some theoretical networks have been proposed to explain other simple neural responses. Deriving a neural network's behavior requires some assumptions about the behavior of the network's components. Many models have been proposed for neuron responses, most of which fall into one of two categories. One is the pulse model, such as the model of McCulloch and Pitts (A logical calculus of the ideas immanent in nervous activity. Bulletin of Mathematical Biophysics 5: 115-133 (1943)) and the "integrate-and-fire" model. The second is the firing rate model, such as that proposed by Hopfield (Neurons with graded response have collective computational properties like those of two-state neurons. Proceedings of the National Academy of Sciences 81: 3088-3092. (1984)). However, a general problem with traditional models is that it is uncertain whether the assumptions hold for real neurons. The more detailed the assumptions are, the greater the uncertainty.

To take just one example, a standard model for neuron response assumes that activation is a nonlinear function of a weighted sum of the inputs. This function may appear to be fairly general, but it cannot express quite simple functions of two or more variables or even produce reasonable approximations of them. For example, a possible neuron response to excitatory inputs X and Y is $R[S(X)+S(Y)]$, where S is a sigmoid function that amplifies large inputs and reduces small ones, and R restricts outputs asymptotically below some physical bound on a neuron's maximum response. Because of the nonlinearity of S, $S(X)+S(Y)$ cannot be expressed as a weighted sum of X and Y. This implies the response function $R[S(X)+S(Y)]$ cannot be expressed as a nonlinear function of a weighted sum of X and Y.

SUMMARY

The present disclosure provides networks to simulate the functions of neural networks of the brain. The explicit networks of various embodiments described herein are formal logic circuits that can discriminate degrees of state, and combinations of degrees of state, of any number of neurons.

In one embodiment, the present disclosure provides a logic circuit comprising Recursive AND NOT Conjunctions (RANCs), comprised from two or more AND NOT gates. A RANC is a general logic circuit that performs conjunctions for $2^n$ possible combinations of truth values of n propositions. The RANCs function dynamically, with capabilities of excitation and inhibition. Networks of RANCs are capable of subserving a variety of brain functions, including creative and analytical thought processes. A complete n-RANC produces all conjunctions corresponding to the $2^n$ possible combinations of truth values of n propositions.

In one embodiment, with input from retinal cones or other inputs that simulate the output of retinal cones, RANCs generate neural correlates of color vision. In another embodiment, with olfactory receptor input or other inputs that simulate the output from olfactory receptors, RANCs recognize patterns of signals to discriminate odors. In a further embodiment, RANCs perform a type of fuzzy logic that has intuitive and advantageous properties, including preserving all of the information in the input signals and separating the stimulus intensity from more useful information conveyed by the stimulus, such as the identity of an odorant or spectral information about a photostimulus. The property measured by RANC outputs may include intervals determined by the inputs and can explain several apparently different characteristics of both color vision and olfaction.

RANCs as disclosed in several embodiments may have applications in other fields. Any logic circuit can be implemented with diodes and transistors, and engineers have begun to implement three-dimensional microprocessors. The architectural efficiency of three-dimensional RANCs may be incorporated into more efficient designs of electronic processors. Efficient forms of complete n-RANCs may predict major aspects of the anatomical structure and physiological organization of the cerebral cortex.

Circuits comprised of multiple RANCs can be constructed with various architectural efficiencies, as compared to traditional Boolean logic circuits. The only hardware requirement is a simple AND NOT gate that provides a measure of the difference between two input values. Here the measure μ of the difference X−Y, denoted by $\mu(X-Y)$, is defined by 1) $\mu(1-0)=1$; 2) $\mu(X-Y)=0$ if $X \leq Y$; and 3) $\mu(X-Y)$ is an increasing function of X and a decreasing function of Y. In some embodiments, fewer than five AND NOT gates are required per output, regardless of the number of inputs. Furthermore, nonlinearities in the AND NOT function do not have serious adverse effects on the fuzzy logic performed by systems of various embodiments. The actual difference between the inputs is not necessary to generate useful fuzzy logic because fuzzy logic deals with largely subjective assignments of truth values and because nonlinearities can be removed from the output before its application if necessary. Useful fuzzy logic follows from the RANC interval measure property which implies that the degree of truth is reflected in the RANC's measure of that truth value. More precisely, as a conjunction's truth value (as measured by the linear difference given in Table 2) increases from 0 to 1, the RANC output's measure of that truth value also increases from 0 to 1. In spite of possible nonlinearities in the AND NOT function, RANC outputs retain all of the information contained in the inputs. The inputs could even be reconstructed from the outputs. For more than a few inputs, RANC architecture can produce Boolean logic with fewer components than conventional electronic Boolean logic arrays.

A Boolean AND NOT gate can be constructed with four transistors (FIG. 6). Since a BC n-RANC requires fewer than five AND NOT gates per output, a Boolean BC n-RANC can be constructed with fewer than 20 transistors per output regardless of the number of inputs. In conventional logic arrays, however, conjunctions that have several inputs are normally constructed separately, unlike BC n-RANCs whose outputs share many AND NOT gates. This means that for conventional electronic logic arrays, the component requirement per conjunction increases without bound as the number of inputs increases.

The architecture of several embodiments is modular and recursive, with each module consisting of a simple combination of a few repeated parts from the previous stage. The minimum-connection-length configuration of components has nearly all connections between adjacent components. This is a fortuitous feature of BC n-RANCs because minimum-connection-length configurations do not in general imply short connections. Short connections reduce computation time as well as material and manufacturing costs. The minimum-connection-length arrangement of components also makes the components fairly densely packed (more than two thirds of the maximum possible density). This is also a fortuitous feature because minimum-connection-length configurations do not in general imply efficient packing. Since nearly all connections are either within layers or between adjacent layers and perpendicular to the layers, the architecture is conducive to a three-dimensional, layered construction, in which five layers are sufficient, regardless of the number of inputs.

Three-dimensional columnar RANCs can be telescoped, or collapsed, to be implemented on a conventional two-dimensional printed circuit board. Although the minimum-connection-length configurations of BC n-RANCs are three-dimensional, these columnar structures can be collapsed to two dimensions with only slightly increased connection lengths. In this case, the hexagonal column layers consisting of six AND NOT gates would become concentric hexagons.

Embodiments described herein also provide for several computational efficiencies, as compared to traditional Boolean logic circuits. Analog AND NOT gates achieve high computational speed as well as minimal hardware requirements by using the variable voltage values of the inputs and outputs to represent fuzzy truth values. A gate made up of only a few components (FIGS. 6 and 11) can provide an output voltage that is a measure of the difference between the input voltages. Digital subtraction in hardware requires many more components and correspondingly more computation time. Digital subtraction in software requires even more time. It should be noted that BC n-RANCs composed of fuzzy AND NOT gates implemented digitally in hardware would still produce fuzzy logic more efficiently than conventional fuzzy logic computation for the other reasons given here.

The RANC organization of connections of various embodiments is also efficient. Due to parallel processing and each AND NOT gate contributing to several outputs, BC n-RANCs produce fuzzy logic far more efficiently than conventional computational methods can achieve. The number of outputs grows exponentially with the number of inputs (2n conjunctions of n propositions), but the time required to compute the output values grows linearly. The total computation time for all 2n outputs is only the time it takes for the input signals to pass through n–1 AND NOT gates. For fuzzy logic with truth values represented digitally, each output would require far more computation time than this whether performed in hardware or software. For computations performed sequentially, the total computation time grows exponentially with the number of inputs.

One aspect of the present disclosure provides a fuzzy OR gate implemented with RANCs. Since any combinational logic function can be expressed as a standard sum of products, a fuzzy OR gate whose inputs are the outputs from a RANC can produce any combinational logic function in both classical and fuzzy logic. Another aspect provides a fuzzy flip flop implemented with linear AND NOT gates. These flip flops combined with fuzzy decoders can produce any sequential logic function in both classical and fuzzy logic.

Still further embodiments of the disclosure provide RANCs implemented recursively in software. Because an n-RANC is defined recursively in terms of (n–1)-RANCs, RANCs could be implemented in software with a simple, recursive subroutine. Such an implementation may function significantly faster than standard fuzzy logic implemented in software, but not as fast as a hybrid implementation of RANCs (see below) or an implementation entirely in hardware. Such a software implementation may be useful for some applications that are somewhat demanding in real-time computation but not as demanding as highly computationally intensive applications, such as robotics.

A hybrid hardware/software implementation of RANCs is possible. A fuzzy AND NOT gate could perform the logic operations, fuzzy memory elements could store these intermediate values, and the rest could be done in software.

Analog AND NOT gates of various embodiments achieve high computational speed and have relatively minimal hardware requirements by using variable voltage values of the inputs and outputs to represent fuzzy truth values. A gate made up of only a few components (FIGS. 6 and 11) can provide an output voltage that is a measure of the difference between the input voltages. Digital subtraction in hardware requires many more components and correspondingly more computation time. Digital subtraction in software requires even more time. It should be noted that BC n-RANCs composed of fuzzy AND NOT gates implemented digitally in hardware would still produce fuzzy logic more efficiently than conventional fuzzy logic computation for the other reasons given here. The RANC organization of connections is also efficient. Due to parallel processing and each AND NOT gate contributing to several outputs, BC n-RANCs produce fuzzy logic far more efficiently than conventional computational methods can achieve. The number of outputs grows exponentially with the number of inputs ($2^n$ conjunctions of n propositions), but the time required to compute the output values grows linearly. The total computation time for all $2^n$ outputs is only the time it takes for the input signals to pass through n–1 AND NOT gates. For fuzzy logic with truth values represented digitally, each output would require far more computation time than this whether performed in hardware or software. For computations performed sequentially, the total computation time grows exponentially with the number of inputs.

In still further embodiments, A fuzzy OR gate is implemented with RANCs. Since any combinational logic function can be expressed as a standard sum of products, a fuzzy OR gate whose inputs are the outputs from a RANC can produce any combinational logic function in both classical and fuzzy logic.

Logic circuits described in various aspects of the disclosure may be used in numerous different applications. For example, electronic applications and biological applications. Although the logic circuits described for many embodiments are quite general, one electronic application in which the logic circuits described herein would be more efficient than existing systems, is in computationally intensive problems that require results in real time. For example, applications in artificial intelligence such as robotics, smart sensors, and expert systems. Other possible uses include classification, control, pattern recognition, speech recognition, and decision making. With respect to biological applications, since the logic circuits in several embodiments model a biological computational system, they have applications in medicine, biotechnology, and nanotechnology. The logic circuits may be used in prostheses for the retina and other parts of the nervous system. Since the components of the logic circuits can be any signaling mechanism, it may be possible to construct these logic circuits from neurons or other biological components such as DNA. Regulatory DNA functions similarly to neurons in that it either activates or suppresses the expression of genes or other regulatory DNA in varying degrees, so this type of logic circuit composed of DNA is theoretically possible. In some aspects, components described herein may be configured to simulate regulatory DNA functions.

In one specific embodiment, an electronic implementation of color vision may be used in applications where currently only the human eye is adequate. For this application the model's responses to an unknown photostimulus are compared to its responses to known photostimuli.

DETAILED DESCRIPTION

Figure 1:
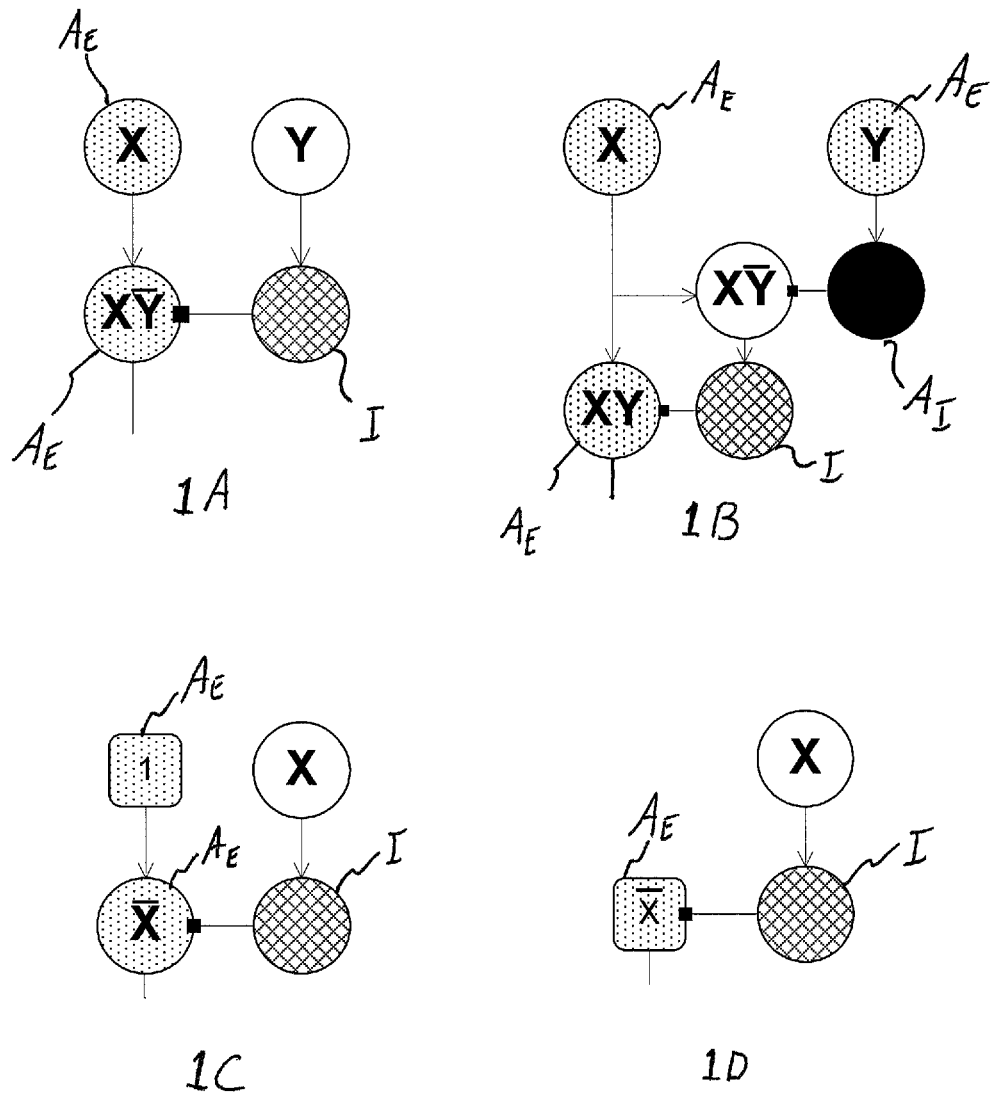
FIG. 1 is an illustration of neurons as functionally complete logic gates according to an embodiment of the disclosure.

The following description first illustrates the difficulty of the task by describing what is required to interpret information contained in several olfactory sensor cell responses to a mixture of odorants. Then logic circuits are described for various embodiments that can effectively summarize the sensory information and provide for perceptual and cognitive distinctions. Although many models have been proposed for neuronal encoding of information, only the minimal, known cellular capabilities of excitation and inhibition are needed to derive the network properties. A neuron with excitatory and inhibitory input is shown to function as a simple logic gate. Several of these logical primitives are connected to form general logic circuits that can perform negations and conjunctions of any number of propositions. The architectures of these circuits are different from the standard architectures of electronic logic circuits in several aspects. In addition to the classical logic of discrete true and false values, these logic circuits perform fuzzy logic operations that can deal with degrees of certainty, which provides capability for processing ambiguous or incomplete information.

Initially, embodiments are described that demonstrate the capabilities of logic circuits that generate neural correlates of complex psychophysical olfactory phenomena for mixtures and varying concentrations of odorants. Other embodiments are described that illustrate the general nature of the networks' capabilities and produce identical phenomena for color vision. The networks' transformation of input data provides basic information processing for the perceptual and cognitive operations of the brain.

Odor Discrimination

In a classic series of experiments, it was shown that each olfactory receptor cell expresses exactly one odorant receptor gene that produces one type of odorant receptor. Humans have been found to have 388 classes of olfactory receptors. The exact number is not critical for the purposes of the embodiments described herein. Each of these cell types responds with varying sensitivity to several related molecules, and cells in different classes have different sensitivities. Each odorant molecule activates several classes of olfactory cells with varying intensity. Most odorants are composed of several odorant molecules. The particular combination of odorant molecules in each odorant induces a corresponding combination of olfactory receptor cell responses that are transmitted to the brain.

In one embodiment, a circuit is provided for discriminating odors based on the signals from receptor cells. As is understood, odor discrimination is accomplished based on the types of molecules present in a sample, and neuron response to the different types of molecules. For example, an odorant may be composed of six different types of molecules, and each of six olfactory receptor types is sensitive to one of these molecules. Some of the possible models for discriminating the odorant have significant problems. Perhaps the simplest model would produce a different sensation for the response of each receptor type. Providing a perception of each component of a pattern does not provide a basis for identifying the pattern; it merely shifts the pattern, and the problem of identifying it, elsewhere in the brain. Another possibility is to connect a neuron to the receptors in such a way that it is activated if and only if all six of the receptor types are active. This model does not take the odorant's concentration into account. Since each olfactory receptor cell responds with varying sensitivity to several related molecules, a few odorant molecules to which a receptor is highly sensitive can elicit the same response as many molecules to which it is only slightly sensitive. Without some mechanism of separating the effect of the type of molecule from the effect of concentration on receptors' responses, information about the odorant's identity will remain conflated with concentration.

Still another mechanism could normalize the strengths of the six responses to correct for different odorant concentrations and then compare the normalized responses to a stored set of values representing the particular odor. This model has computational obstacles. Although normalizing several values is a simple process mathematically, connecting logic gates to implement such a procedure is not, regardless of the kind of hardware used. The same is true of the other two processes—comparing several values and arriving at a single conclusion based on the comparisons. Moreover, nonlinearities in neural response functions greatly increase the complexity of the task. Although the brain is capable of such computationally intensive operations, the required logic circuits would be quite large and complex.

A far more difficult problem than the above example is discrimination of the individual odors in a mixture of odorants. The patterns of receptor responses produced by odorant mixtures can be quite complex, especially when two or more of the components of a mixture contain some of the same or similar molecules that activate the same receptor types. Even a mixture of just two odorants can elicit a wide variety of receptor responses when both the proportion of each odorant and the concentration of the mixture are varied. Identifying the component odorants is correspondingly challenging.

One of the basic concepts of information theory is that the smaller the probability of an event, the more information it contains. This means that if a particular molecule is present in most odorants, its absence holds more information about an odorant's identity than its presence. For example, suppose an olfactory receptor type X is sensitive to a molecule that is present in all but four odorants. Signals from one or more receptor types but not from X narrow the identity of an odorant to four possibilities. An odorant that does not contain the common molecule has such a small probability, and therefore conveys so much information, that just two additional bits of information are necessary to identify the odorant among the four possibilities. Even if a molecule is present in only a few odorants, its absence still carries some information about an odorant's identity.

Because of the information contained in null responses, the set of receptor types that are best suited to identify an odorant may contain receptor types that are not sensitive to the odorant as well as types that are. As a simple example, suppose an odorant is the only odorant that elicits relatively high intensity responses from receptor types X1 and X2 and relatively low intensity responses from types X3 and X4. Discrimination of the odorant can be based on some measure of the extent to which all four of these conditions are satisfied. One possibility is a neuron whose response intensity is a measure of the difference between the smaller of the responses from receptors X1 and X2 and the larger of the responses from X3 and X4.

Neuronal Encoding of Information

Neuron responses to single excitatory inputs have been shown to amplify the effect of large inputs and reduce the effect of small inputs. This response property acts as a natural noise filter for low-level noise that is added to high or low intensity signals. If a neuron's input channel is carrying no signal, low-level noise in the channel is reduced or eliminated by such a response function. If an input signal that is near the maximum intensity is decreased by additive noise, amplification reduces or eliminates the effect of the noise. In that case, the standard response model that assumes a nonlinear function of a weighted sum of the inputs would not be appropriate. A linear weighting function for each input does not filter noise. Nor can the nonlinear function of the weighted sum effectively filter additive noise. This is because the weighted sum of low-level noise in several input channels can be large enough to be indistinguishable from a strong signal in one of the input channels.

Known characteristics of cellular behavior are sufficient to show the networks of the embodiments described herein generate known phenomena. Some types of neurons and sensory receptors have graded responses rather than all-or-nothing action potentials. For most types, however, the intensities of the input and output can be measured, and the most basic relationship between input and output is known: The intensity of an external stimulus is reflected in the sensory receptor's response, and this intensity is carried over in the signal's transmission from receptor to neuron and from neuron to neuron. Cells whose responses consist of action potentials are generally thought to convey the intensity in the frequency of action potentials.

Table 1 lists these basic properties of cellular signals in somewhat more detail. The response intensity is assumed to be measured at some moderate level of adaptation. Phenomena associated with adaptation are not considered here, so a constant level of adaptation is assumed. For convenience, response intensities are normalized by dividing them by the maximum possible intensity for the given level of adaptation. This puts response intensities in the interval from 0 to 1, with 0 meaning no signal and 1 meaning the maximum intensity. This number is referred to herein as the response intensity or simply the response of the receptor or neuron. If a neuron's response is not 0, the neuron is said to respond. Normalizing the responses does not affect any of the derived results. To avoid confusion, it should be noted that for cells that transmit all-or-nothing action potentials, or the response as referred to herein, is the normalized frequency of action potentials, not a measure of the membrane potential or how near the potential is to the threshold for an action potential.

TABLE 1

Cellular Response Properties

1. $1 \sim 0 = 1$. Maximum excitation elicits maximum response.
2. $X \sim Y = 0$ if $X \leq Y$. Inhibition cancels equal or smaller excitation.
3. $X \sim Y$ is increasing in X. Greater excitatory input increases output.
4. $X \sim Y$ is decreasing in Y. Greater inhibitory input decreases output.
5. Olfactory receptor response is an increasing function of odorant concentration.
6. Photoreceptor activity is a decreasing function of photostimulus intensity.

In Table 1, the properties of the neural logic circuits follow from the networks' architectures and the minimal, well-known cellular characteristics listed here. If X and Y are two cells' response intensities, $X \sim Y$ represents the response of a neuron with excitatory input X and inhibitory input Y. Responses are normalized to be in the interval from 0 to 1

Most neurons in the cortex either excite or inhibit other cells, but not both. Excitatory cells can inhibit by exciting an inhibitory cell. If the responses of two sensory receptors or neurons are X and Y, the notation $X \sim Y$ will represent the response of a neuron with excitatory input X and inhibitory input Y. The properties in Table 1 that say the response $X \sim Y$ is an increasing or decreasing function refer to the fact that input and output intensities are variables; the response is not increasing or decreasing with time.

Little information is available for the actual behavior of the neuron response function $X \sim Y$, for example. Property 2 may actually be $X \sim Y = 0$ if $g(X) \leq Y$ for some function $g(X)$ that only loosely approximates the identity function $I(X) = X$. Such minor adjustments in the properties of Table 1 would modify the conclusions about the networks only by degrees; they would not negate the conclusions.

Neural AND NOT Gates

A few elementary concepts of classical logic are described here to show that neurons can function as logic gates. The customary logic notation will be used. Variables X and Y represent truth values of propositions. The value 0 stands for false, and 1 stands for true. The notation XY stands for the value of the conjunction X AND Y (X and Y are both true), $\overline{X}$ stands for NOT X (X is not true), and $$\prod_{i=1}^{N} X_i$$

stands for $X_1 X_2 \ldots X_N$ (all $X_i$ are true). These logic functions have the customary truth values: $XY=1$ if and only if $X=Y=1$, $\overline{X}=1$ if and only if $X=0$, and $$\prod_{i=1}^{N} X_i = 1$$

if and only if $X_1 = \ldots = X_N = 1$. For the recursive logic identities given in the next section to be true, $$\prod_{i=1}^{0} X_i$$

is defined to be 1. For now, neuron responses are assumed to be either 0 or 1 to coincide with the values of classical logic. Intermediate neuron responses between 0 and 1 will be described in later embodiments. A neuron's response can represent the truth value of a proposition. For example, the response of an olfactory receptor cell can be interpreted as the truth value of "the receptor cell is activated."

FIG. 1 illustrates neurons as functionally complete logic gates. The circuit diagrams of FIGS. 1A, 1B, 1C, 1D illustrate that neurons with excitatory and inhibitory inputs and neurons that have continuously high outputs form a functionally complete set, meaning any logic circuit can be constructed with them. The label on each neuron represents its response. The maximum and minimum possible responses 1 and 0 can stand for the logical values true and false, making the network outputs logical functions of the inputs. The diagrams show logic gates for (1A) X AND NOT Y, (1B) X AND Y, and (1C, 1D) NOT X. Arrows indicate excitatory input; blocks indicate inhibitory input. Spontaneously active neurons are square. To illustrate example inputs and outputs, active neurons are designated with an 'A.' Inactive inhibitory cells are designated with an 'I.'

Property 1 of Table 1 says the cellular response X~Y is 1 if X=1 and Y=0. By property 2, X~Y is 0 for the other three possible combinations of X and Y values. The logical conjunction $X\overline{Y}$ (X AND NOT Y) has the same truth values. This means the neuron performs the logical AND NOT function: $X\sim Y = X\overline{Y}$. A neuron with one excitatory input and one inhibitory input will be called a neural AND NOT gate. Its response property $X\sim Y = X\overline{Y}$ is the neural AND NOT property. This logic gate is illustrated in the circuit diagram in FIG. 1A. Active neurons include active excitatory neurons designated as $A_E$, and active inhibitory neurons designated as $A_I$. The cells that provide input to the networks in the figures are not considered part of the networks and need not even be near the networks. Such cells could be sensory cells or the output cells of other networks. For networks comprising neural AND NOT gates, their outputs can be determined either by the properties of Table 1 or, usually more conveniently, by the neural AND NOT property and the algebra of classical logic. For example, X~(X~Y) denotes the response of a cell that has excitatory input X and inhibitory input X~Y, as illustrated in FIG. 1B. This response is the logical AND function XY because $X\sim(X\sim Y) = X\sim(X\overline{Y}) = X\overline{(X\overline{Y})}$ by the neural AND NOT property, and $X\overline{(X\overline{Y})} = XY$ by the algebra of classical logic. It might appear that the function X AND Y could be achieved simply by a cell with two excitatory inputs, X and Y, but this cell's output would be the logical function X OR Y since a high value of either X or Y would activate the cell.

FIG. 1C illustrates a logic circuit of another embodiment known as an inverter. If a neural AND NOT gate has inhibitory input X and excitatory input from a neuron whose response is constantly 1, then the output 1~X is the logical NOT function $\overline{X}$ because $1\sim X = 1\overline{X} = \overline{X}$. A response that is constantly 1 could be provided by a special purpose neuron that fires spontaneously and continuously, as are known to exist in the brain. Such neurons keep people awake, for example, and sleep apparently requires inhibition of these neurons. Alternatively, the NOT cell itself could be a spontaneously active neuron with only inhibitory input, as illustrated in FIG. 1D. In the figures, spontaneously active cells are square to distinguish them from other cells. Any spontaneously active cell could be replaced by an ordinary cell with continuous excitatory input. A single spontaneously active neuron could provide continuous excitatory input to several ordinary cells, making them function the same as spontaneously active cells.

An AND gate and a NOT gate are logical primitives that together make up a "functionally complete" set, meaning for every possible logical proposition there is a way to define it in terms of the members of the set. For a complex logical proposition, however, such a definition may not be obvious, and a definition that provides an efficient architecture for implementing a logic circuit for the proposition is likely to be even more obscure. FIG. 1 shows that both AND gates and NOT gates can be constructed from AND NOT gates and gates that have continuously high output. This means that a neuron with excitatory and inhibitory inputs and a neuron that has a continuously high output are logical primitives that make up a functionally complete set. With one exception, embodiments described herein contain neural AND NOT gates and spontaneously active neurons.

Functionally complete components are especially significant when they are available in large numbers, and the abundance of neurons is the main distinguishing feature of the human brain. Given any function that can be executed by a computer, for example, and given enough functionally complete components, there is a way to construct a logic circuit that performs the function. This also applies to any set of functions that any number of computers could conceivably perform, with parallel or sequential processing, including everything computer software could possibly do because any software can be implemented in hardware and vice-versa.

The logic circuits described herein differ from electronic logic circuits in several ways besides the obvious differences in the physical natures of their components. Logical AND NOT gates are not common in electronic systems. Electronic logic circuits are often implemented with NOR (not or) or NAND (not and) gates because these gates are relatively economical to produce with transistors and semiconductor diodes and because they are sole sufficient operators, meaning each is functionally complete by itself. Because of this difference, the architecture of the logic circuits herein is new. Each of the logical primitives NOR and NAND requires several electronic components, whereas one neuron with a second neuron providing inhibitory input can function as a neural AND NOT gate. Although it would be possible to construct NOR and NAND gates from neural AND NOT gates and spontaneously active neurons, and then use these components to assemble logic circuits with the standard architecture found in logic design textbooks, the resulting networks would be needlessly complex and require far more neurons than necessary using the described gates. A property discussed later is that neurons can have responses of varying intensity, while most electronic logic gates encode information in discrete zeros and ones. As will be understood upon reading the description, this neuronal capability is a powerful tool in processing information. Furthermore, logic circuits formed with AND NOT gates require no more component gates than standard electronic logic circuits using NOR or NAND gates.

Recursive AND NOT Conjunctions

The networks presented here are general logic circuits that can perform logical negations and conjunctions of any number of propositions. Logical conjunctions determine whether or not several conditions are satisfied. Much of the brain's information processing involves such decision making, from controlling breathing, heart rate, and balance, to discerning form, movement, and faces, to producing the creative and analytic thought processes involved in reasoning, planning, and decision-making. For example, a photostimulus is perceived as green when the M cone (that is sensitive to medium wavelengths of light) has a high absorption of photons and the S and L cones have low absorptions. The compound proposition "M has a high absorption, and S has a low absorption, and L has a low absorption" is a conjunction of three propositions. A neural correlate of the perception of green is the response of a neuron that is activated when the conjunction is true.

The logic identities in the first column of Table 2 show that every conjunction is logically equivalent to a single AND NOT conjunction $A\overline{B}$. To make them clear, A and B are enclosed in braces. These logic identities are easily verified by the algebra of classical logic. The identities are recursive and reductive. Equations 1 and 2 say that a conjunction of n=M+N propositions is logically equivalent to $A\overline{B}$, where A and B are each conjunctions of n−1 propositions. By the same equations, each of the conjunctions A and B is equivalent to the conjunction of two propositions that are each conjunctions of n−2 propositions, and so on, until A and B are two of the propositions $X_i$ and $Y_j$. Equations 3 and 4 say a conjunction of N propositions is equivalent to a conjunction $A\overline{B}$, where A is a conjunction of N−1 propositions and B is a conjunction of N propositions. Proposition A can be further reduced by equation 3 or 4, and B can be reduced by equation 1 or 2.

Here the significance of recursively equating every conjunction to $A\overline{B}$, where A and B are reduced conjunctions, is that it shows how conjunctions can be implemented entirely with neural AND NOT gates by repeated use of the neural AND NOT property $A\overline{B}=A\sim B$. For example, if M=2 and N=1, equation 1 says $X_1X_2\overline{Y_1}=\{X_1\overline{Y_1}\}\overline{\{X_1\overline{X_2}\}}$. Applying the neural AND NOT property three times, this can be implemented as $\{X_1\overline{Y_1}\}\sim\{X_1\overline{X_2}\}=(X_1\sim Y_1)\sim(X_1\sim X_2)$. Substituting $X_3$ for $Y_1$ gives $X_1X_2\overline{X_3}=\{X_1\overline{X_3}\}\sim\{X1\overline{X_2}\}=(X_1\sim X_3)\sim(X_1\sim X_2)$. This network will be seen shortly in the next figure.

If M=N=1, equations 1 and 2 in Table 2 both reduce to $X\overline{Y}=X\overline{Y}$, and this conjunction is implemented as $X\sim Y$. For more inputs, equations 1 and 2 show two different ways of implementing the same conjunction. If N=1, equation 1 requires fewer neurons and retains a negated component in both A and B, $\overline{Y_1}$ and $\overline{X_M}$ respectively. Similarly if M=1, equation 2 requires fewer neurons and retains a non-negated component in both A and B, $X_1$ and $Y_N$ respectively. The implementation that has fewer neurons also has the important property of measuring differences between inputs. This property is discussed later with intermediate input values. If M and N are both greater than 1, either implementation can be used. The two resulting networks are different but have the same architecture and the same number of neurons. Although equations 1 and 2 work equally well for implementing a single conjunction, they are used in an alternating pattern in this embodiment to obtain the most efficient architecture for several conjunctions.

TABLE 2

Recursive AND NOT Conjunction definitions and responses

| Recursive logic identity for constructing a RANC | Interval measured by the RANC response | Approximate value of the RANC response |
|---|---|---|
| 1. $\prod_{i=1}^{M} X_i \prod_{j=1}^{N} \overline{Y_j} = \left\{\prod_{i=1}^{M-1} X_i \prod_{j=1}^{N} \overline{Y_j}\right\}\overline{\left\{\prod_{i=1}^{M-1} X_i \prod_{j=1}^{N-1} \overline{Y_j X_M}\right\}}$ | $[\max_{j=1}^{N}\{Y_j\}, \min_{i=1}^{M}\{X_i\}]$ | $\|\min_{i=1}^{M}\{X_i\} - \max_{j=1}^{N}\{Y_j\}\|$ |
| 2. $\prod_{i=1}^{M} X_i \prod_{j=1}^{N} \overline{Y_j} = \left\{\prod_{i=1}^{M} X_i \prod_{j=1}^{N-1} \overline{Y_j}\right\}\overline{\left\{Y_N \prod_{i=1}^{M-1} X_i \prod_{j=1}^{N-1} \overline{Y_j}\right\}}$ | | |
| 3. $\prod_{i=1}^{N} X_i = \left\{\prod_{i=1}^{N-1} X_i\right\}\overline{\left\{\prod_{i=1}^{N-1} X_i \overline{X_N}\right\}}$ | $[0, \min_{i=1}^{N}\{X_i\}]$ | $\min_{i=1}^{N}\{X_i\}$ |
| 4. $\prod_{j=1}^{N} \overline{Y_j} = \left\{\prod_{j=1}^{N-1} \overline{Y_j}\right\}\overline{\left\{Y_N \prod_{j=1}^{N-1} \overline{Y_j}\right\}}$ | $[\max_{j=1}^{N}\{Y_j\}, 1]$ | $1 - \max_{j=1}^{N}\{Y_j\}$ |

In Table 2, The logic identities in the first column equate every conjunction to a conjunction $A\overline{B}$. The recursive and reductive identities show how logic circuits can be implemented with neural AND NOT gates using the neural AND NOT property $A\overline{B}=A\sim B$. The second column shows the interval measured by the corresponding RANC response. The third column shows the approximate value of the response is the length of the interval. The notation $\|b-a\|$ stands for the length of the interval [a, b] if a<b, and 0 otherwise.

A conjunction logic circuit that is constructed from AND NOT gates according to the recursive logic identities of Table 2 is a Recursive AND NOT Conjunction (RANC). For n propositions that have one of two possible truth values, true or false, there are $2^n$ possible combinations of truth values. Each combination corresponds to a conjunction of n propositions. For two propositions X and Y, for example, there are four conjunctions: XY, $X\overline{Y}$, $\overline{X}Y$, and $\overline{XY}$. An n-RANC produces one or more conjunctions of n propositions. A single n-RANC produces one of the conjunctions, and a complete n-RANC produces all of the 2n possible conjunctions.

Figure 2:
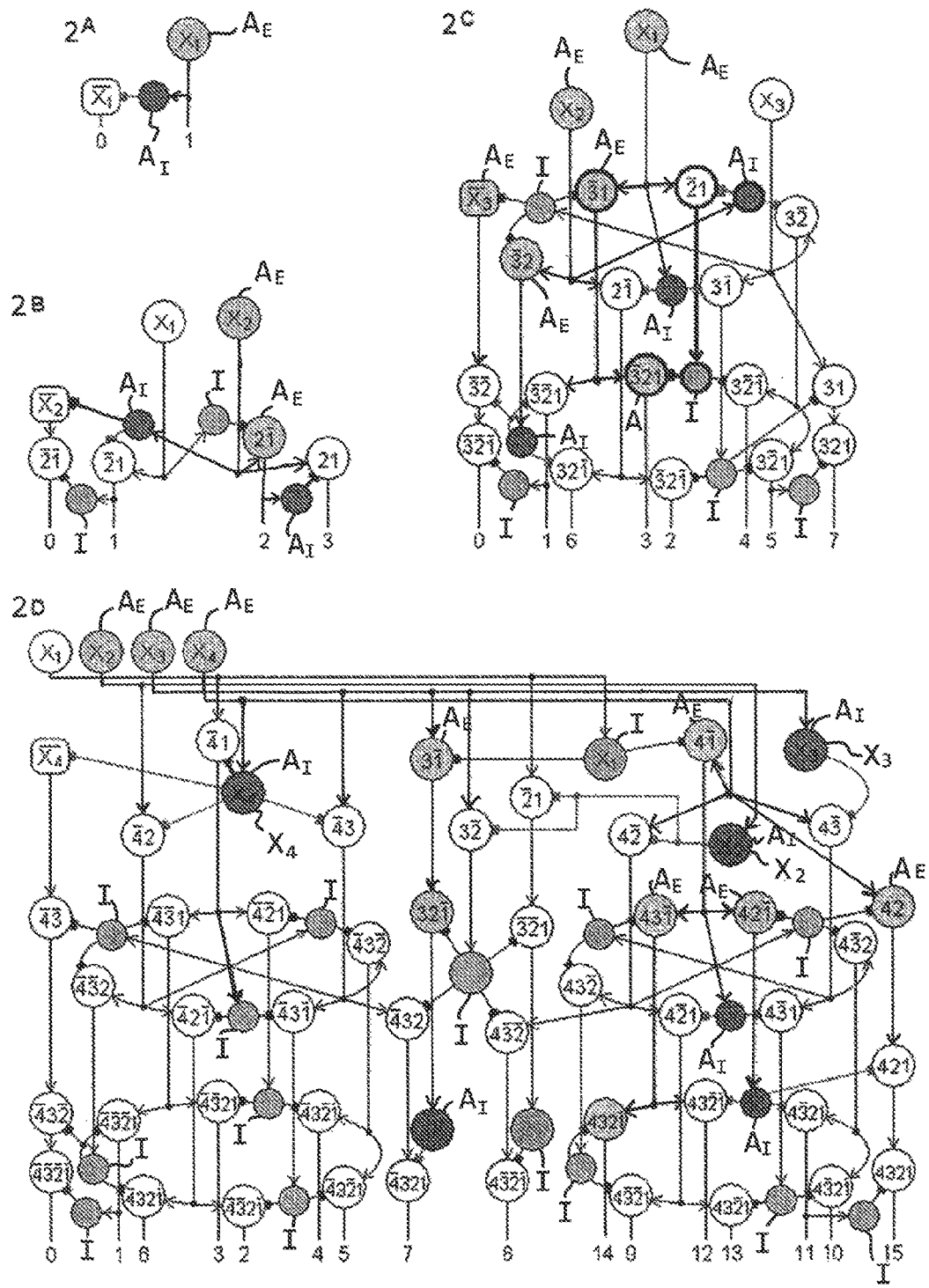
FIG. 2 illustrates complete n-RANCs for n=1-4 of an embodiment of the disclosure.

FIG. 2 illustrates RANCs for an embodiment. An n-RANC is a general logic circuit that produces conjunctions of n propositions. A complete n-RANC produces all conjunctions corresponding to the $2^n$ possible combinations of truth values of n propositions. Examples of complete n-RANCs are illustrated in FIGS. 2A-2D for n=1-4. A single n-RANC produces one of the possible conjunctions. In 2C, the single 3-RANC that produces output number 3, $\overline{X_3}X_2X_1$, is indicated by thick lines. In 2D, the output number 14, $X_4X_3X_2\overline{X_1}$=1, represents the truth value of the conjunction "$X_2$, $X_3$, and $X_4$ are high, and $X_1$ is not high." The other 15 conjunctions are false, and the corresponding RANC outputs are 0.

Examples of circuit networks for complete n-RANCs are illustrated in FIG. 2 for n=1-4. The illustrations are three-dimensional because the networks' geometric properties of simplicity and symmetry that can be achieved in three-dimensional space are not apparent in conventional two-dimensional circuit diagrams. The views are exploded to show the cells and their connections clearly. All of the RANCs are in columnar structures. The columns could be oriented in any direction (as are cortical columns), but in the figures they are oriented with a vertical axis and the outer layer at the top to agree with customary depictions of the cortex. As in FIG. 1, active cells are indicated as 'A' in FIG. 2 to illustrate example responses.

For subscripted conjunctions, only the subscripts are shown. For example, the response $\overline{X_3}X_2X_1$ is abbreviated as $\overline{3}$ 21. In this abbreviated notation, the earlier example $X_1X_2\overline{X_3}=\{X_1\overline{X_3}\}\sim\{X_2\overline{X_3}\}$ is written $\overline{3}$ 21=$\overline{3}$ 1~$\overline{2}$ 2. The cells with these abbreviated labels are illustrated with thick lines in FIG. 2C. The subscripts are written in descending order to match the standard digit ordering of the numeric labels for the networks' outputs. For example, the binary number 011 equals the decimal number 3 ($0(2^2)+1(2^1)+1(2^0)$=3). The response $\overline{3}$ 21 in FIG. 2C is labeled "3" below the network because it has the value 1 if and only if the inputs $X_3$, $X_2$, $X_1$ are 0, 1, 1, respectively. This particular state of RANC cell responses is illustrated by the active cells (A) in FIG. 2C. The whole number labels for the RANC outputs are meant to provide a short and mnemonic way of referring to the different outputs, but the labels should not be confused with the variable output values.

Fuzzy Logic

As discussed above, RANCs are logic circuits that produce the conjunctions of classical logic when the inputs have the binary values of 0 and 1. However, neurons normally respond with a variety of intensities that reflect the intensities of their inputs. This raises the question of what function the RANCs produce for intermediate inputs. The RANC outputs are a generalization of standard fuzzy logic truth values, and this RANC fuzzy logic has biologically adaptive properties and generates correlates of brain phenomena.

As is known, the field of fuzzy logic was developed expressly to mimic the human brain in making decisions based on information that is ambiguous, imprecise, or incomplete. Because this is the kind of data the brain receives from its sensory systems, some kind of fuzzy logic is virtually a necessity for the brain to cope successfully with the external world. In fuzzy logic, propositions such as "It's cold" and "The car is moving fast" can have intermediate degrees of truth between absolutely false and absolutely true. That is, the truth value can be any number in the interval from zero to one. Fuzzy logic has been successful in a variety of practical applications, especially in Japan and Europe. However, how neurons perform logical functions using intermediate information states remains virtually unknown.

Applications of fuzzy logic are normally implemented on electronic processors, and nearly all electronic logic gates encode information in high and low values, i.e., 0 and 1, simply because that is the most efficient and reliable way of processing information with electronic components. This means all numbers, including decimal fractions, are encoded in sequences of zeros and ones. That method of encoding numbers makes implementation of fuzzy logic computationally intensive. Neurons, of course, are different. Since a neuron's response can be any number in the interval [0, 1], it can represent the fuzzy truth degree of a proposition. Implementation of fuzzy logic with neurons is therefore much more efficient.

A truth function defines the truth value of a proposition composed by connectives (conjunction, disjunction, negation) in terms of the truth values of its components. One of the central questions in fuzzy logic is how the truth functions of classical logic should be extended to include intermediate truth values. Any such truth function should agree with classical logic when the components have the binary values of 0 and 1, but many functions do this. The simplest and most commonly used fuzzy truth function for conjunction is $XY=\min\{X, Y\}$, the smaller of X and Y. The intuitive rationale for this function is that the proposition XY should have a high truth value if and only if both X and Y have high truth values. For negation, the most common function is $\overline{X}=1-X$. The intuitive rationale is that the proposition $\overline{X}$ should have a high truth value if and only X has a low truth value. The next paragraph discusses that the functions in the third column of Table 2 extend these standard fuzzy truth functions for conjunction and negation to conjunctions of any number of components with any of the components negated. The next section describes that RANCs produce a generalization of this fuzzy logic.

The second column in Table 2 contains intervals [a, b]. The third column contains the lengths of the corresponding intervals in the second column. The notation $\|b-a\|$ in the third column stands for the length of the interval [a, b]; that is, $\|b-a\|=b-a$ if $a<b$, and $\|b-a\|=0$ if $a\geq b$. The interval lengths of the third column define a fuzzy truth function for the corresponding propositions on the left side of the logic identities 1-4 in the first column. These truth values are consistent with classical logic when the components have the binary values of 0 and 1. The truth values also generalize the standard fuzzy truth functions of the preceding paragraph: If N=2, the truth value of proposition 3 in the first column is $X_1X_2=\min\{X_1, X_2\}$; and if N=1, the truth value of proposition 4 is $\overline{X_1}=1-X_1$. The truth values for propositions 3 and 4 are implied by the truth value for proposition 1 since $$\prod_{i=1}^{N} X_i = \prod_{i=1}^{N} X_i(\overline{0})$$

and min $\|\min_{i=1}^{N}\{X_i\}-\max\{0\}\|=\min_{i=1}^{N}\{X_i\}$; and $$\prod_{j=1}^{N} \overline{Y_j} = (1)\left(\prod_{j=1}^{N} \overline{Y_j}\right)$$

and $\|\min\{1\}-\max_{j=1}^{N}\{Y_j\}\|=1-\max_{j=1}^{N}\{Y_j\}$. The intuitive rationale for the truth value for conjunction 1 is that $$\prod_{i=1}^{M} X_i \prod_{j=1}^{N} \overline{Y_j}$$

should have a high truth value if and only if all $X_i$ have high truth values and all $Y_j$ have low truth values. The truth value $\|\min_{i=1}^{M}\{X_i\}-\max_{j=1}^{N}\{Y_j\}\|$ is consistent with this view.

RANC Fuzzy Logic

It is noted that nonlinear neuron responses cannot produce the linear functions of the third column in Table 2. RANC responses do, however, come close to these values, and they convey just as much information. An important RANC property used frequently in the following discussions is that the neuron response for the conjunction in the first column of Table 2 is a measure (defined immediately below) of the corresponding interval in the second column. This will be referred to as the RANC interval measure property. The property can be proven by induction on the number of inputs, using the cellular properties of Table 1 and the RANC definitions of Table 2.

A mathematical measure, usually designated by μ, is a broad generalization of length. For the purposes of this disclosure, a function μ[a, b] is defined to be a measure of any interval [a, b] if (1) μ[0, 1]=1; (2) μ[a, b]=0 if a≥b; and (3) μ[a, b], <μ[c, d] if [a, b] ⊂ [c, d]. By this definition, the length ||b−a|| is itself a measure of the interval [a, b]. Properties 1 and 2 in the definition imply that any measure of the intervals in the second column of Table 2 agrees with classical logic values for the conjunctions in the first column when the components have the binary values of 0 and 1. This means that any measure of the intervals in the second column of Table 2 is a fuzzy truth function for the conjunctions in the first column. Any such measure also generalizes the standard fuzzy truth functions for conjunction and negation.

Because of the importance of the RANC interval measure property and because the property may not be obvious, an abbreviated proof is given here for the RANC defined by equation 1 of Table 2. The proofs for RANCs defined by the other equations are similar. The proof is by induction on n=M+N. For M=N=1, the conjunction in equation 1 is $X\overline{Y}$. This is implemented as X~Y, which is a measure of the interval [Y, X] by the properties of Table 1. For M>1 and N≥1, it must be shown that the measure properties hold for n=M+N assuming they hold for n−1.

By equation 1 of Table 2, the RANC implementation of $$\prod_{i=1}^{M} X_i \prod_{j=1}^{N} \overline{Y_j}$$

is A~B, where A and B are the responses of the RANC implementations of $$\prod_{i=1}^{M} X_i \prod_{j=1}^{N} \overline{Y_j}$$

and $$\prod_{i=1}^{M} X_i \prod_{j=1}^{N} \overline{Y_j X_M},$$

respectively. The networks for A and B each have n−1 inputs, so it is assumed by induction that the response A is a measure of the interval $[\max_{j=1}^{N}\{Y_j\}, \min_{i=1}^{M-1}\{X_i\}]$ and B is a measure of $[\max_{j=1}^{N-1}\{Y_j, X_M\}, \min_{i=1}^{M-1}\{X_i\}]$. It must be shown that A~B is a measure of $[\max_{j=1}^{N}\{Y_j\}, \min_{i=1}^{M}\{X_i\}]$.

To derive property 1 of a measure, $[\max_{j=1}^{N}\{Y_j\}, \min_{i=1}^{M}\{X_i\}]=[0, 1]$ implies all $Y_j$ are 0 and all $X_i$ are 1. By the induction assumption, A=1 because it is a measure of [0, 1] and B=0 because it is a measure of [1, 1], so A~B=1 by property 1 of Table 1. For property 2 of a measure, $\max_{j=1}^{N}\{Y_j\}\geq\min_{i=1}^{M}\{X_i\}$ implies either $\max_{j=1}^{N}\{Y_j\}\geq\min_{i=1}^{M-1}\{X_i\}$ or $\min_{i=1}^{M-1}\{X_i\}>\max_{j=1}^{N}\{Y_j\}\geq X_M$. In the first case, A=0 because A is a measure of $[\max_{j=1}^{N}\{Y_j\}, \min_{i=1}^{M-1}\{X_i\}]$ by the induction assumption, and therefore A~B=0 by property 2 of Table 1. In the second case, $\max_{j=1}^{N}\{Y_j\}\geq\max_{j=1}^{N-1}\{Y_j, X_M\}$. This implies A≤B since the neural measure of $[a, \min_{i=1}^{M-1}\{X_i\}]$ is decreasing in a. Then A~B=0 by property 2 of Table 1.

For property 3 of a measure, it is shown here that A~B is increasing in $\min_{i=1}^{M}\{X_i\}$. The proof that and A~B is decreasing in $\max_{j=1}^{N}\{Y_j\}$ is similar. There are several cases to consider. Here it is shown that A~B is increasing in $\min_{i=1}^{M}\{X_i\}$ for two values of $X_M$ satisfying $\max_{j=1}^{N}\{Y_j\}\leq X_M(1)<X_M(2)\leq\min_{i=1}^{M-1}\{X_i\}$. The other cases have similar or simpler arguments. If $X_M=X_M(1)$, $\max_{j=1}^{N-1}\{Y_j, X_m\}=\min_{i=1}^{M}\{X_i\}=X_M(1)$. If $X_M=X_M(2)$, $\max_{j=1}^{N-1}\{Y_j, X_M\}=\min_{i=1}^{M}\{X_i\}=X_M(2)$. By induction, the neuron response B is assumed to be a measure of the interval $[\max_{j=1}^{N-1}\{Y_j, X_M\}, \min_{i=1}^{M-1}\{X_i\}]$. If $X_M=X_M(1)$, B is a measure of $[X_M(1), \min_{i=1}^{M-1}\{X_i\}]$. Call this response value B(1). Similarly, if $X_M=X_M(2)$, B is a measure of $[X_M(2), \min_{i=1}^{M-1}\{X_i\}]$ and labeled B(2). Since $X_M(1)<X_M(2)$ and B is decreasing in $\max_{j=1}^{N-1}\{Y_j, X_M\}$ by the definition of a measure, B(1)>B(2). Finally A~B is decreasing in B, so A~B(1)<A~B(2). This shows A~B is increasing in $\min_{i=1}^{M}\{X_i\}$. This concludes the proof that A~B is a measure of $[\max_{j=1}^{N}\{Y_j\}, \min_{i=1}^{M}\{X_i\}]$.

By the definition of a measure, the RANC interval measure property says that a RANC response for a conjunction in column 1 of Table 2 increases from 0 to 1 as the endpoints of the corresponding interval in column 2 increase the interval length from 0 to 1. As before, this does not mean the response increases with time. If neuron responses were perfectly linear functions of their inputs, it can easily be shown from properties 1 and 2 of Table 1 that the RANC response would be equal to the length of the interval it measures. This implies the RANC response approximates the length of the interval, with the accuracy of the approximation depending on how close neuron response functions are to being linear. To the extent that neuron responses are approximately linear, the interval lengths in the third column of Table 2 can be taken as approximations of the corresponding RANC responses for the conjunctions in the first column.

The RANC interval measure property has two important consequences. First, for each of the possible orderings of the input intensities, such as $0=X_2<X_1<X_3<1$, exactly one set of a complete n-RANC's output cells responds. That is, the combination of output cells that respond uniquely identifies the ordering of the input intensities. For the example above, the input ordering is $0=X_2<X_1<X_3<1$ if and only if a complete 3-RANC has positive responses $X_3\overline{X_2}X_1$, $X_3\overline{X_2}\overline{X_1}$, and $\overline{X_3}\overline{X_2}\overline{X_1}$. For another example, the input ordering is $0=X_2<X_1=X_3=1$ if and only if a complete 3-RANC has a single positive response $X_3\overline{X_2}X_1$. This identification of the input ordering is unambiguous in the sense that it is independent of the magnitude of the positive RANC output responses.

In general, the RANC interval measure property implies that a positive response $\overline{X_1}\ldots\overline{X_n}$ means all inputs are less than 1, and a positive response $X_1 \ldots X_n$ means all inputs are greater than 0. The positive output with the fewest negations in its response name indicates which inputs are smallest. If this output has more than one negated input, those inputs are equal. The positive output with the second fewest negations must contain the same negated inputs as the output with the fewest negations. The additional negated inputs are the second smallest inputs, and they are equal if there is more than one. Each additional positive output with the next fewest negations indicates the next smallest inputs.

Secondly, the input intensities partition the interval [0, 1] into subintervals, and the RANC response intensities are measures of the subintervals. The response intensity $X_1 \ldots X_n$ is a measure of the interval from 0 to the smallest input or inputs, the intensity of the positive output with the fewest negations is a measure of the interval between the smallest input or inputs and the next smallest inputs, and so on. The response $\overline{X_1} \ldots \overline{X_n}$ is a measure of the interval from the largest input or inputs to 1.

The RANC interval measure property also implies three more properties. Since n inputs partition the interval [0, 1] into at most n+1 subintervals and the RANC response intensities are measures of these subintervals, a complete n-RANC can have at most n+1 positive responses out of its $2^n$ responses. Because the RANC responses are approximately the lengths of the subintervals, the sum of a complete n-RANC's outputs is approximately 1. This bound on the outputs implies that not many of them can be large.

Functions of several variables, such as statistical functions, typically lose much of the information contained in the data. The two properties of RANC responses, identifying the input ordering and measuring the intervals formed by them, mean RANC responses retain all of the information in the inputs, but in a different form. The inputs could even be reconstructed from the outputs. The reconfigured information produced by RANCs is biologically adaptive and predicts known phenomena.

RANC Fuzzy Logic Predictions of Olfactory Phenomena

Initially, the function of discriminating odors is discussed. The fuzzy logic produced by RANCs effectively solves the problem of discriminating odors. Consider the earlier example of an odor that is perceived whenever the olfactory receptor responses $X_1$ and $X_2$ are relatively high and $X_3$ and $X_4$ are low. By the RANC interval measure property, the 4-RANC output $\overline{X_4}\overline{X_3}X_2X_1$ is a neural correlate of this perception. A moderate concentration of an odorant might elicit moderate receptor responses, say $(X_1, X_2, X_3, X_4)=(0.4, 0.5, 0.0, 0.0)$. The response $\overline{X_4}\overline{X_3}X_2X_1$ is a measure of the interval $[\max\{X_3, X_4\}, \min\{X_1, X_2\}]=[0.0, 0.4]$, and the response is approximately its length, 0.4.

Figure 3:
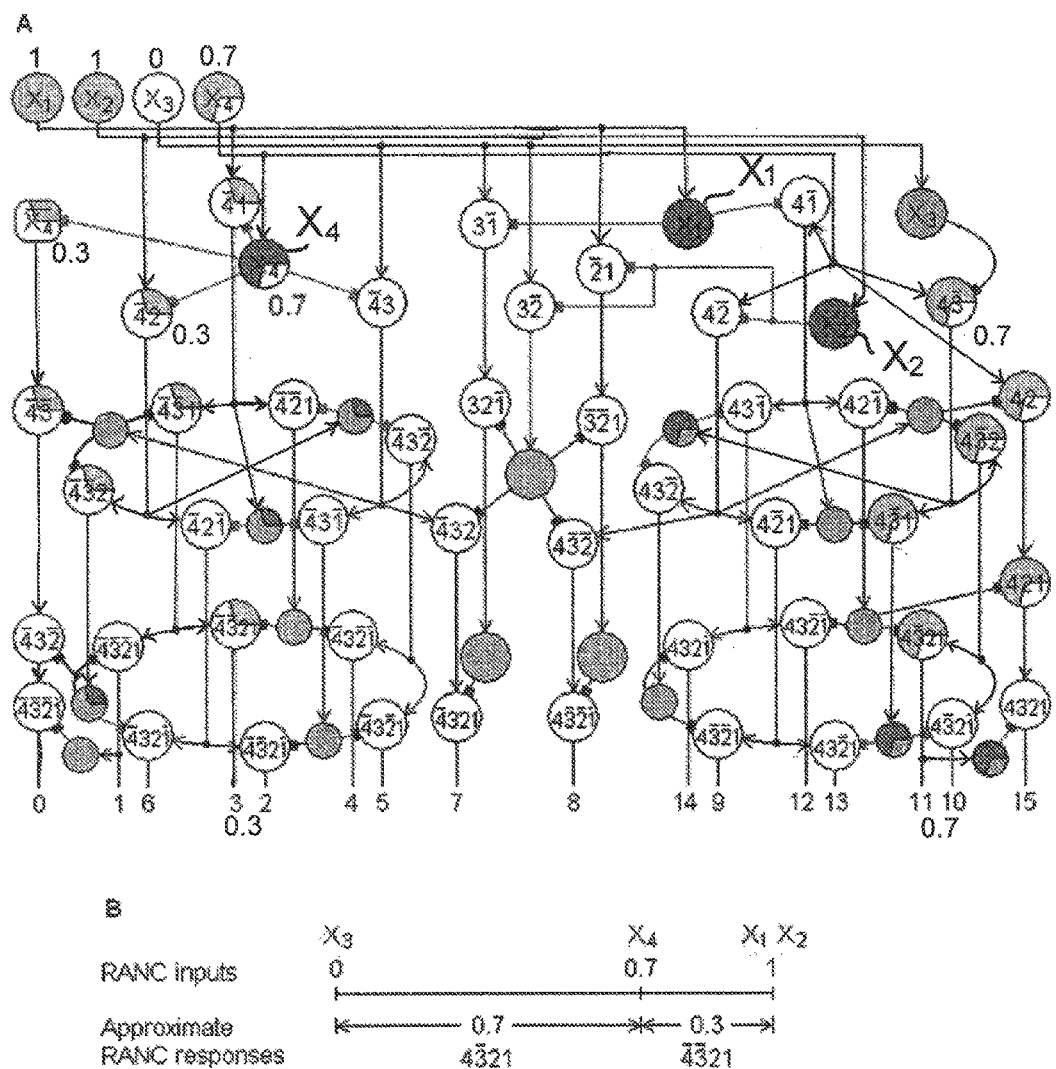
FIG. 3 illustrates a circuit of a complete 4-RANC of an embodiment.

The fuzzy logic of RANCs also discriminates individual odors in a mixture of odorants, even odorants that activate nearly identical sets of receptor types. For example, assume a second odor is perceived whenever the receptor responses $X_1$, $X_2$, and $X_4$ are relatively high and $X_3$ is low. The output $X_4\overline{X_3}X_2X_1$ is a neural correlate of this perception. A certain concentration of an odorant could elicit the responses $(X_1, X_2, X_3, X_4)=(0.8, 0.6, 0.0, 0.7)$. The response $X_4\overline{X_3}X_2X_1$ is a measure of $[X_3, \min\{X_1, X_2, X_4\}]=[0.0, 0.6]$, and the response is approximately 0.6. Since the third and fourth receptor types are relatively insensitive to the first odorant, a mixture of the two odorants could elicit responses $(X_1, X_2, X_3, X_4)=(1.0, 1.0, 0.0, 0.7)$. In this case the same two RANC cells are activated, correctly identifying the component odorants, and their response intensities are $\overline{X_4}\overline{X_3}X_2X_1 \approx \min\{X_1, X_2\}-\max\{X_3, X_4\}=1.0-0.7=0.3$ and $X_4\overline{X_3}X_2X_1 \approx \min\{X_1, X_2, X_4\}-X_3=0.7-0.0=0.7$. This state of RANC responses is illustrated in FIG. 3. Note that neither of these 4-RANCs responds to the wrong odorant. The response $X_4\overline{X_3}X_2X_1$ is 0 when the receptor states are $(X_1, X_2, X_3, X_4)=(0.4, 0.5, 0.0, 0.0)$ because $X_3=X_4$. Similarly $\overline{X_4}\overline{X_3}X_2X_1$ does not respond to $(0.8, 0.6, 0.0, 0.7)$ because $X_2<X_4$.

FIG. 3 illustrates fuzzy logic of a complete 4-RANC of an embodiment. The exemplary figure in 3A shows the approximate computations of a complete 4-RANC when one of the inputs has an intermediate value between 0 and 1. The graph in 4B illustrates the RANC interval measure property: The output intensities (approximately 0.7 and 0.3) are measures of the subintervals ([0, 0.7], and [0.7, 1]) of [0, 1] formed by the input intensities of 3A. The combination of output cells that respond ($X_4\overline{X_3}X_2X_1$ and $\overline{X_4}\overline{X_3}X_2X_1$) uniquely identifies the ordering of the input intensities ($0=X_3<X_4<X_1=X_2=1$). The response $\overline{X_4}\overline{X_3}X_2X_1 \approx 0.3$ represents the fuzzy truth value of the conjunction "$X_1$ and $X_2$ are high and $X_3$ and $X_4$ are not high."

If only one single n-RANC responds, that is the RANC correlate of a unique odor, i.e., one in which no more than one odor can be discriminated. A complete n-RANC has exactly one positive response if and only if all inputs have the binary values 0 or 1. Correlates of unique odors can also be produced by RANCs in several additional ways. Some single n-RANCs may not be present because they are not needed. For example, the output labeled 0, $\overline{X_1}\overline{X_2} \ldots \overline{X_n}$, responds when there is no stimulus. Eliminating this single n-RANC would also eliminate the need for a spontaneously active neuron. Other single n-RANCs may not be needed because some combinations of receptor responses may not occur for any stimulus or because some combinations may be produced by substances that never had selective pressure for detection. If some single n-RANCs are not present, an odorant that would produce several responses in a complete n-RANC could elicit a single response from an incomplete n-RANC. Alternatively, if an odorant produces m outputs from a complete n-RANC, and the order of the inputs from the receptors uniquely identifies the odorant. The m outputs in this case identify the input ordering, which in turn identifies the odorant. The m outputs could be fed as inputs to a single m-RANC that produces $X_1 \ldots X_m$. This cell responds if and only if all m inputs are positive. A response from this single cell indicates the input ordering that uniquely identifies the odorant. Finally, selective pressure to produce a unique response to a biologically important odorant could result in just the right sensitivity in several receptors so that the odorant produces just one response value in the receptors. For example, six receptor types responding to four different molecules in an odorant and two that are not in the odorant might have responses $0=X_1=X_2<X_3=X_4=X_5=X_6$. If the single 6-RANC for $\overline{X_1}\overline{X_2} \ldots \overline{X_6}$ is not present, the only positive 6-RANC response is $\overline{X_1}\overline{X_2}X_3X_4X_5X_6$.

The number of odors that can be discriminated is now discussed for several embodiments. The RANCs show how the brain can discriminate a large number of odors in the different patterns of signals from a few hundred types of olfactory receptors. In some reports, humans can distinguish as many as 400,000 odors. This can be accomplished either by several RANCs that have input from a few sensor types or by a few RANCs with many inputs. For example, 388 receptor types can provide inputs to 27 distinct complete 14-RANCs. The total number of cells required is just over two million. Redundancies and other error-correcting mechanisms would of course require somewhat more cells. Each complete 14-RANC can have up to 21421=16,383 outputs, not counting the output labeled 0, for a total of 442,341 outputs. Each of these responses could be the neural correlate of a distinct odor.

The networks, in other embodiments, may be more complex than this model of distinct networks. Some single n-RANCs may not be needed, as was pointed out at the end of the preceding section. Some networks may overlap. For example, some single 10-RANCs might have inputs from receptor types labeled 1-10 for odors whose discrimination depends on various combinations of those receptor responses, and some single 14-RANCs could have inputs from receptor types 6-19. These networks could have some overlap in the first few layers. Overlapping RANCs with 388 inputs could produce an immense number of distinct outputs, each one correlated with a distinct odor. In addition, several RANC output cells can respond simultaneously in various combinations and at various intensities, making possible an even larger number of distinguishable odors in mixtures. Clearly, RANCs show the number of distinguishable odors is determined by such factors as selective pressure or physical limitations of sensory cells rather than any limitation in the brain's computational ability to discriminate different patterns of sensory signals.

It is noted that in some situations stimulus intensity may perceptually independent. A biologically adaptive property of olfaction is produced by RANCs. Within certain limits, the brain separates stimulus intensity from more useful information about the source of the stimulus. Under most ordinary circumstances, the brain can identify an odor independently of its strength. A skunk's odor smells like a skunk regardless of its concentration. This perceived constancy under changes of stimulus intensity cannot result directly from the sensory receptor responses. This is because, as was pointed out earlier, receptor responses depend on the type of stimulus as well as the intensity of the stimulus: A few odorant molecules to which an olfactory receptor cell is highly sensitive can elicit the same response as many molecules to which it is only slightly sensitive. The ordering of receptor response intensities, however, does not change with stimulus intensity. By the RANC interval measure property, exactly one set of a complete n-RANC's output cells respond for each of the possible orderings of the inputs. At different concentrations, an odor is consistently identified by the set of RANC output cells that respond to it.

In other situations, perception may depend on stimulus intensity. In contrast to the perceptual constancy of the preceding paragraph, the perceptions of some odors vary with the odorant concentration. This is also predicted by RANCs under certain circumstances. Consider the earlier examples of the RANC correlates of the perceptions of two odors, $\overline{X_4X_3}X_2X_1$ and $X_4\overline{X_3}X_2X_1$, and a substance that produces the receptor response state $(X_1, X_2, X_3, X_4) = (1.0, 1.0, 0.0, 0.7)$. As before, this state elicits responses of approximately 0.3 and 0.7 from the two RANC outputs. Since receptor type $X_3$ is insensitive to this substance and $X_1$ and $X_2$ are saturated, $X_4$ will be most affected by a change in concentration. An increased concentration that produces $(X_1, X_2, X_3, X_4) = (1.0, 1.0, 0.0, 0.8)$ would decrease $\overline{X_4X_3}X_2X_1$ to approximately 0.2 and increase $X_4\overline{X_3}X_2X_1$ to approximately 0.8. This is the correlate of a change in the perceived strengths of the two odors.

Perceptions of mixtures provide good tests of any model because mixtures can elicit complex patterns of sensory receptor responses that result in numerous and varied perceptions that can differ markedly from the perceptions of the mixture's components. In many odorants, more than one odor can be discriminated. The perceived complexity of an odorant is the number of odors that can be discriminated. A unique odor has complexity of one (1).

Several studies have explored perceptions of odors in mixtures. The experiments support the conclusions that are summarized as four general properties, discussed below. These phenomena are especially good tests of any model that attempts to explain them because they provide several detailed examples of complex perceptions. The RANC predictions of the phenomena follow from the RANC interval measure property.

The first general property is that perceived complexity in a single odorant can be greater than in a mixture of several odorants. A complete n-RANC produces this phenomenon when a mixture produces fewer different receptor response intensities than the components. In the following example, substances A and B both have complexity 2, and the mixture of A and B has complexity 1. Suppose substance A elicits the olfactory receptor responses of the earlier example illustrated in FIG. 3: $(X_1, X_2, X_3, X_4) = (1.0, 1.0, 0.0, 0.7)$. As before, the complete 4-RANC with these inputs produces correlates of two odors: $X_1X_2\overline{X_3X_4} \approx 1.0 - 0.7 = 0.3$ and $X_1X_2\overline{X_3}X_4 \approx 0.7 - 0.0 = 0.7$. Now suppose substance B produces receptor responses $(X_1, X_2, X_3, X_4) = (1.0, 0.4, 0.0, 1.0)$. This also produces correlates of 2 odors: $X_1\overline{X_2X_3}X_4 \approx 1.0 - 0.6 = 0.4$ and $X_1X_2\overline{X_3}X_4 \approx 0.4 - 0.0 = 0.4$. According to property 5 of Table 1, a receptor's response to a mixture is at least as great as the response to any of the mixture's components. The mixture of A and B therefore produces receptor responses $(X_1, X_2, X_3, X_4) = (1.0, 1.0, 0.0, 1.0)$. This results in only one 4-RANC response, $X_1X_2\overline{X_3}X_4 = 1.0 - 0.0 = 1.0$, so the mixture's complexity is 1.

The second general property is that no more than three or four odors can be discriminated in mixtures. By the RANC interval measure property, the sum of a complete n-RANC's outputs is approximately 1. This bound on the outputs implies that not many of the outputs can be large.

The third general property is that the chemical complexity of an odorant is not correlated with the perceived complexity. The RANC's explanation follows from the fact that the chemical complexity of an odorant is not correlated with the number of different intensities of receptor responses. For example, several receptor types could have different sensitivities to a chemically simple substance. By the RANC interval measure property, the number of RANC outputs depends on the number of different inputs. The several different receptor response intensities produce several RANC outputs. If each output is a correlate of a perceived odor, this chemically simple substance has a large perceived complexity. Similarly, a chemically simple substance could have a small perceived complexity if it produces a small number of different receptor responses. Alternately, a chemically complex substance could have either a small or large perceived complexity, depending on whether it produces a small or large number of different receptor responses.

The fourth general property is that perceived complexity is not additive when odorants are mixed. It is noted that this property is implied by property 1 above. The sum of the perceived complexities of two or more odorants is greater than the perceived complexity of each odorant. That is, the sum of two or more positive numbers is greater than each of the numbers. The first property discussed above says the perceived complexity in one of these odorants can be greater than the perceived complexity of the mixture of all of them. In that case, the sum of the perceived complexities of the components is greater than the perceived complexity of the mixture. The example in the above explanation of the first property shows that the RANC correlate of complexity is not additive: The sum of the component complexities is 2+2=4, and the complexity of the mixture is 1.

RANC Fuzzy Logic Predictions of Color Phenomena

Initially the Relative Absorption Model of Color Vision is discussed. The RANCs presented in this disclosure are a refinement and generalization of a color vision model. This model provides that a "Relative Absorption Model" (RAM) is an explicit retinal network that receives input from three classes of retinal cones and generates neural correlates of the perceptions of red, green, blue, yellow, black, and white. The RAM was shown to account for several phenomena central to color vision, such as the continuous yet categorical nature of color, mutually exclusive colors and colors that can be perceived together, color mixing, the Bezold-Brücke hue shift, the additivity failure of brightness, opponent-color cells, geometrical color space, and hue, saturation, and brightness.

Figure 4:
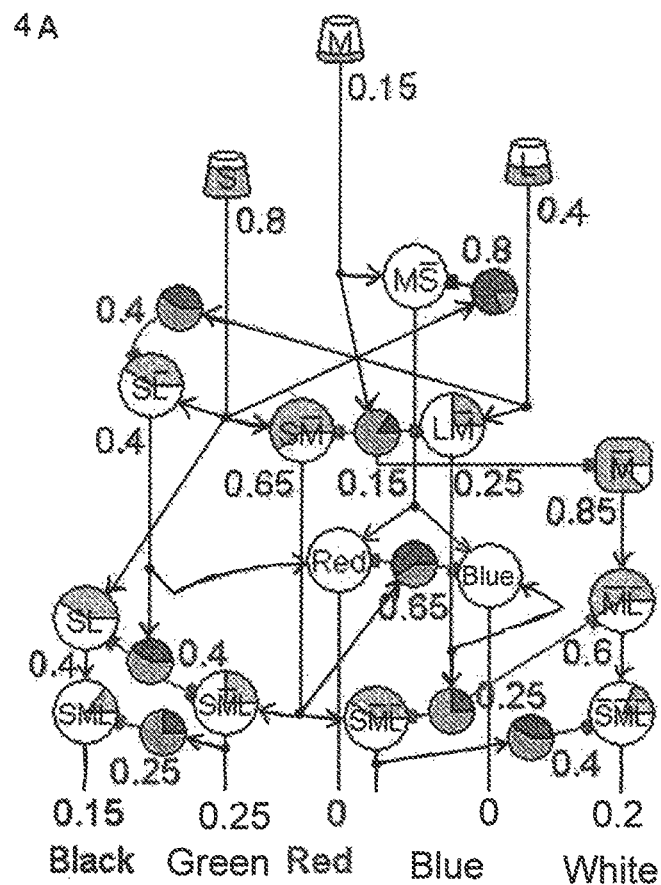
FIG. 4 illustrates relative absorption model responses to photostimulus of an embodiment.
Figure 4:
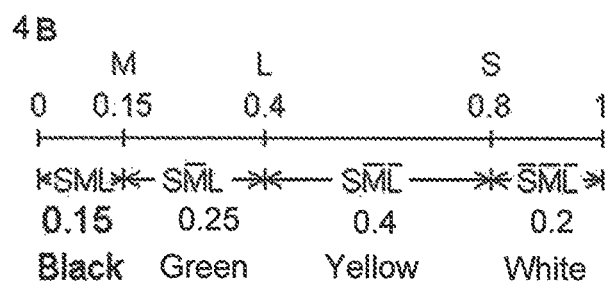

FIG. 4 illustrates Relative Absorption Model responses to a greenish-yellow photostimulus of an embodiment. A greenish-yellow photostimulus moderately represses the L cone response and strongly represses the M cone so that M<L<S. The RAM's responses to a somewhat desaturated greenish-yellow photostimulus for this example, shown in 4A, are correlates of the perception of the photostimulus. The graph in 4B shows that the approximate RAM responses illustrate the RANC interval measure property. The response S$\overline{ML}$≈0.25 represents the fuzzy truth value of the conjunction "S and L are high and M is not high." Since this state of cone responses is the condition for the perception of green, S$\overline{ML}$≈0.25 also represents the fuzzy truth value of the proposition "The photostimulus is green." That is, S$\overline{ML}$≈0.25 is the correlate of the perceived strength of the green component of the photostimulus. The logic network is illustrated in FIG. 4 that provides outputs based on inputs from photoreceptors. The embodiment of FIG. 4 is a modified 3-RANC that has inputs from the three classes of retinal photoreceptors and produces neural correlates of color vision. In this figure, S, M, and L stand for the responses of cones that are sensitive to short, medium, and long wavelengths of light.

The outputs numbered 1 and 5 in FIG. 2C that are missing from FIG. 4 are $\overline{SM}L$ and $\overline{SML}$, which would convey purple and violet information, respectively. A more detailed treatment of violet and purple information is given in the article "Relative absorption model of color vision," Color Research and Application 30:252-264, Yoder L (2005), which is incorporated herein by reference in its entirety. Psychophysical evidence shows that this information is transmitted through the red and blue channels rather than through two separate channels, possibly because there was never selective pressure for the ability to obtain the complete violet and purple information. Some information is unavoidably lost in transmitting it through the red and blue channels. The combined violet and purple information is measured by M$\overline{S}$, and FIG. 4 shows this response is transmitted through the red and blue channels. Except for the additional input MS to the red and blue cells, the networks for all of the outputs in FIG. 4 are single 3-RANCs.

The RANCs were designed to form conjunctions with architectures that minimize the number of neurons required; they were not designed to fit available data about the brain. Transmitting the violet and purple information through the red and blue channels is the only exception to this design methodology, and it is only a partial exception. When it is determined that violet and purple will not have their own dedicated channels, for whatever reason, RANCs predict that the information must be transmitted through the red and blue channels. They are the only RANC channels that can convey the information without a substantial loss of information. The reasons for this are given in the above-mentioned article.

The new RAM in FIG. 4 is a refinement of the original in three ways. The networks for the black and white cells in FIG. 4 are RANCs. Second, these networks require fewer cells to produce the black and white outputs than the original RAM. Third, the RANC interval measure property shows that the white cell's response is a measure of how far the largest of the three cone responses is suppressed below the maximum possible response. In the original RAM, this white cell response property depended on a linear approximation of the white cell's response to its inputs.

The color names for the responses in FIG. 4 may appear to contradict the responses' logical names written on the cells. Unlike other sensory receptors, photoreceptors in vertebrates depolarize and emit transmitters spontaneously and continuously in the absence of a stimulus, and this tonic activity is suppressed by light absorption. The more light that is absorbed, the more the receptor activity is suppressed. This is the reason for property 6 of Table 1. The photoreceptors' decreasing activity function makes color perceptions somewhat counterintuitive when stated in terms of photoreceptor activity rather than photon absorption. For example, green is perceived when the M cone absorbs more photons than the S and L cones, and this high absorption suppresses the M cone activity to a lower level than the S and L responses.

The preceding section showed that RANCs can account for complex olfactory phenomena. Since RANCs also generate correlates of color vision, they predict identical color phenomena. Here it is shown that the RAM does produce neural correlates of these well-known phenomena. Because the phenomena are experienced in different sensory systems, they may not have been previously recognized as the same. How the RAM generates color phenomena may be more transparent than the RANC's explanations of olfactory phenomena because color phenomena are more familiar and because more is known about the specific photoreceptor states that produce specific phenomena. This specificity also makes more stringent demands on any model that proposes to account for the phenomena. The RAM explanations of the phenomena are the same as the RANC explanations for olfaction, except that photostimuli suppress photoreceptor activity. Except for the Bezold-Brücke hue shift, discussed immediately below, these color properties were not included in the noted article.

Color perception is largely independent of photostimulus intensity. A yellow banana appears to be yellow independently of the illuminant's intensity. The RAM's explanation of perceived color constancy is the same as the RANC's explanation for olfaction: The RAM cells that respond to a photostimulus depend on the ordering of the cones' responses, and that ordering does not change with photostimulus intensity. The cases where color perception does vary with photostimulus intensity is significant because the RAM not only predicts this can happen, but it also predicts which colors will change and in what ways. The change in color perception is known as the Bezold-Brücke hue shift. Specifically, orange and greenish yellow both appear yellower at higher photostimulus intensities; violet and greenish blue appear bluer.

The RAM correlate of this effect will be explained here for greenish yellow. The RAM explanations of the other color changes are similar. A photostimulus that is perceived as greenish yellow has little effect on the S cones, suppresses the L cones somewhat, and suppresses the M cones the most of the three types. The cone response ordering is M<L<S. Unless the photostimulus is perceived to be desaturated with black or white components, there must be significant separation between the cone responses. That means the M cone is highly suppressed by the photostimulus, the S cone is only slightly suppressed or not at all, and the L cone is moderately suppressed. The L cone's mid-level response is therefore the most sensitive to changes in the photostimulus intensity. An increase in photostimulus intensity suppresses the L response closer to M and further from S. By the RANC interval measure property, this increases the RAM's yellow cell response and decrease the green cell response. That is, the RAM produces a correlate of the perception of a yellower hue at higher photostimulus intensities. Note that the photostimulus is perceived as yellower but still greenish yellow, as the RAM predicts: The RAM's green and yellow cells' response intensities change with the photostimulus intensity, but only the green and yellow color cells respond. The RAM also correctly predicts that hue shifts do not occur for unique colors. The photoreceptor response ordering for a unique yellow cell response, M=L<S, remains the same under changes in illuminant intensity. The RAM predicts a yellow banana will appear to be yellow over a wide range of illuminant intensities.

Just as more than one odor can be discriminated in an odorant, more than one hue can be perceived in a photostimulus. Red, green, blue, and yellow can each be perceived as a unique hue, meaning no other hue is perceived with it. A unique hue has complexity 1. Hues perceived as color pairs, such as greenish yellow, have complexity 2. If perceptions of black and white are counted, a photostimulus perceived as a desaturated greenish yellow could have complexity as great as 4. The RAM predicts perceptual phenomena in photostimulus mixtures that are analogous to perceptions of odors in mixtures. Perceptions of color mixtures have been explored in some detail in the past. The results of these studies verify the RAM predictions.

Perceived complexity in a single photostimulus can be greater than in a mixture of several photostimuli. Color mixing experiments have shown that a greenish-yellow photostimulus superimposed on a reddish-yellow, or orange, photostimulus can be perceived as a unique yellow. The complexity of each of the non-unique components is greater than the unique yellow of the mixture. The RAM explanation is that a photostimulus perceived as greenish yellow elicits cone responses M<L<S. By the RANC interval measure property, the photostimulus produces a RAM correlate of greenish yellow with green and yellow cell responses. Similarly a photostimulus perceived as reddish yellow elicits cone responses L<M<S and red and yellow RAM cell responses. The mixture can produce cone responses M≈L<S and a unique yellow RAM cell response by the RANC interval measure property.

Color perception tests show no more than two unique colors can be perceived together—red and yellow, yellow and green, green and blue, blue and red. These color pairs can be perceived as desaturated with black and white. This bound on the number of hues that can be perceived together is predicted by the RANC interval measure property—a complete 3-RANC can have at most 4 positive outputs. Because the RANC interval measure property also implies the sum of the RAM's outputs is approximately 1, the RAM further predicts that not all four components of the color perception can be strong. When a greenish-yellow photostimulus is desaturated with both black and white components, for example, the perceived strength of at least one of these components is often so minute that identifying all four is difficult for most observers.

A monochromatic photostimulus (of a single wavelength or a narrow band of wavelengths) has the least spectral complexity. A monochromatic photostimulus with wavelength around 550 nm is perceived as greenish yellow, while a photostimulus with a complex spectral distribution can be perceived as unique yellow. This means that neither green nor red is perceived with it. The RAM accounts for this, as both the M and L cones are sensitive to wavelengths near 550 nm, but the M cone is more sensitive. The monochromatic photostimulus at 550 nm suppresses both the M and L cones, but suppresses the M cone more than the L cone, producing green and yellow RAM cell responses by the RANC interval measure property. The complex photostimulus has a balance of wavelengths that suppress the M and L cones approximately equally, producing only a yellow RAM cell response. Alternately, a monochromatic photostimulus with wavelength around 570 nm is perceived as unique yellow, while a photostimulus with a complex spectral distribution can be perceived as greenish yellow. The RAM explanation is that the M and L cones are approximately equally sensitive to the monochromatic photostimulus at 570 nm. The M and L cones are suppressed approximately equally, producing only a yellow RAM cell response. The complex photostimulus suppresses the M and L cones unequally, producing green and yellow RAM cell responses.

Perceived complexity is not additive when photostimuli are mixed. The color example in the above explanation of property 1 shows that perceived complexity is not additive: The sum of the complexities of greenish-yellow and reddish-yellow is 2+2=4, and the complexity of unique yellow perceived in the mixture is 1.

RANC Differences

The RANCs are different from most models of brain functions in several ways. They were designed to form specific logic circuits—conjunctions—with architectures that minimize a specific cost function—the number of neurons. With the partial exception for transmitting violet and purple information in the color vision model, RANCs were not designed to fit available data about the brain. In this sense, the phenomena the networks generate are genuine predictions about the brain. The RANC architectures are explicit, showing all cells and their synaptic connections; network properties do not depend on assumed "black box" capabilities of unspecified component networks or unspecified networks later in the information processing pathway. The cellular properties of excitation and inhibition are also explicitly stated; results do not depend on assumptions of sophisticated or unknown cellular capabilities.

The RANC properties given here can be proved rigorously based on the networks' architectures and the minimal cellular capabilities of excitation and inhibition; claims about network behavior do not depend on simulations that only show the demonstrated properties hold for the particular function or functions that are assumed to simulate the operation of network components. Explicit networks that generate neural correlates of known brain phenomena may explain how neurons are connected to produce those phenomena; mathematical models and networks that are not explicit cannot explain how neurons create phenomena, no matter how accurately the models might describe them. Finally, RANCs function dynamically, so their operation is consistent with the speed of most brain functions; RANC properties do not rely on any structural change, such as neurogenesis or altered synaptic connections, nor do they require any change in the way cells function, such as a change in synaptic strength or the strength of action potentials.

Most of the neurons in the networks of the illustrated embodiments show fewer synaptic connections than are typical of actual neurons. This does not necessarily mean all networks in the brain operate fundamentally differently from these networks. The networks show the simplest or nearly simplest ways neurons can be connected to perform conjunctions. For a variety of reasons, neurons in the brain may have more connections while performing the same functions in essentially the same ways. For example, the RANCs as presented here do not have redundancies or other error-correcting mechanisms. These mechanisms alone could account for much of the massive connectivity of the brain. Other reasons for multiple connections are implied by the most efficient forms of RANC architecture and may exist. The networks of embodiments of this disclosure illustrate that logic circuits composed of neurons can perform known brain functions. Actual networks in the brain could be organized like these minimal networks in principle while being more elaborate in the details.

FIGS. 2A-C define the cells and connections of the complete n-RANC for n=1, 2, 3. In cases where n>3, the complete n-RANC is defined recursively in terms of two complete (n−1)-RANCs, with some modifications described below. If the inputs to the complete n-RANC are $X_1, \ldots, X_n$, the inputs to one complete (n−1)-RANC are $\overline{X_n}X_1, \ldots, \overline{X_n}X_{n-1}$, and the inputs to the other are $X_n\overline{X_1}, \ldots, X_n\overline{X_{n-1}}$. This definition is illustrated in FIG. 2D, which illustrates a complete 4-RANC that is constructed from two complete 3-RANCs. To avoid confusion it is noted that although both RANCs and complete n-RANCs are defined recursively, a RANC is defined by the logic identities of Table 2 but a complete n-RANC is defined more narrowly.

The recursive definition of a complete n-RANC produces a complete n-RANC because conjoining a proposition (A) with each of the inputs (X and Y) to an AND NOT gate simply results in conjoining that proposition with the output ($X\overline{Y}$): by the neural AND NOT property, $(AX) \sim (AY) = (AX)(\overline{AY})$, and $(AX)(\overline{AY}) = AX\overline{Y}$ by the algebra of classical logic. The propositions joined to the inputs are passed along through the entire (n−1)-RANCs and are joined to the outputs. The first (n−1)-RANC produces the outputs labeled 0 to $2^{n-1}-2$, and the second produces outputs $2^{n-1}+1$ to $2^n-1$.

Figure 5:
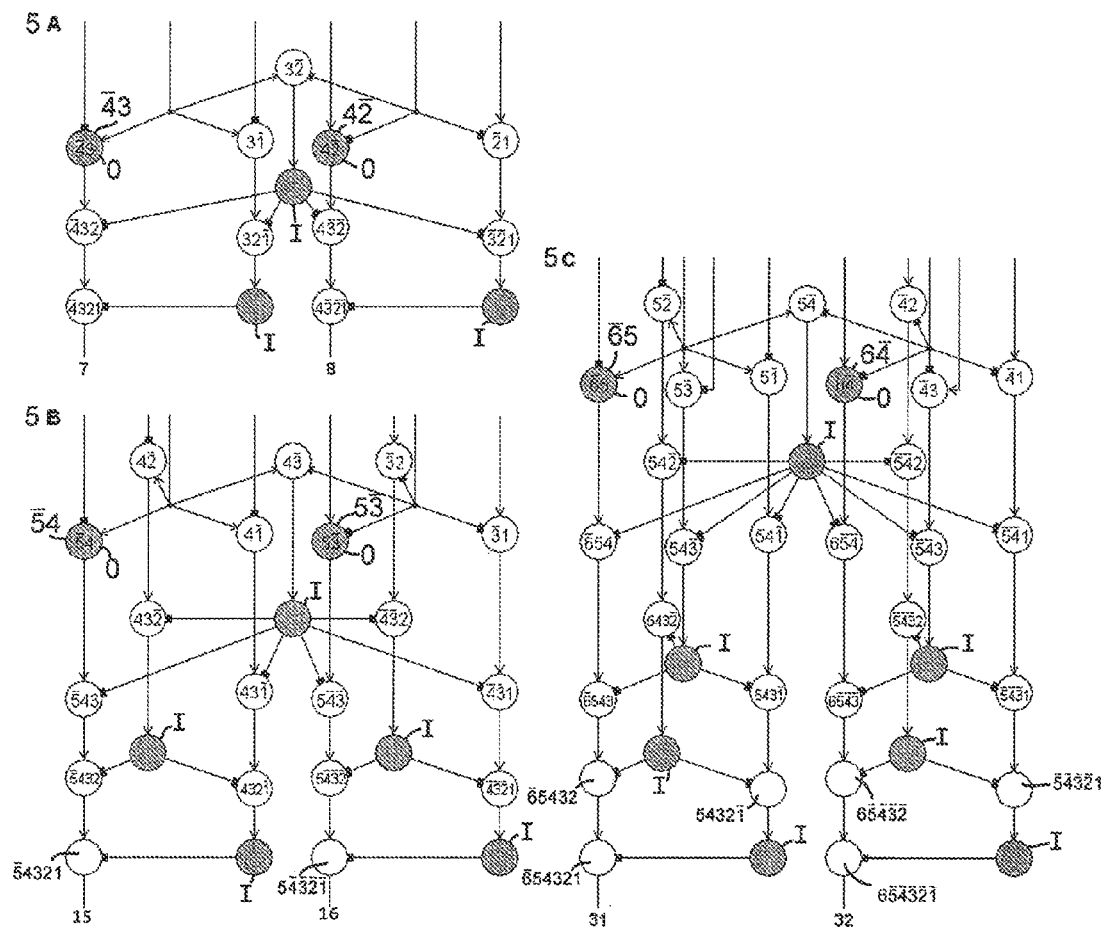
FIG. 5 illustrates non-hexagonal columns of n-RANCs of an embodiment.

Some modifications are required in parts of this recursive process as compared to the process as described above. Straightforward modifications are required for the single n-RANCs that produce the outputs labeled 0 and $2^n-1$ so that they are produced according to the logic identities 3 and 4 in Table 2. These n-RANCs are shown on the left and right sides of FIG. 2A-D. The single n-RANCs for the outputs labeled $2^{n-1}-1$ and $2^{n-1}$ are constructed differently from the recursive definition of a complete n-RANC because they must conform to equations 1 and 2 in Table 2 to have the interval measure property. These single n-RANCs are in non-hexagonal columns, but they have essentially the same architecture as a single n-RANC that forms part of a hexagonal column. Examples of such columns are shown in FIG. 2D for n=4 and in FIG. 5 for n=4, 5, 6. The modifications required to transform these non-hexagonal columns into the n-RANCs for the next successive value of n are clear from the pattern in FIG. 5: For each column a copy of the third layer from the top is inserted above this layer. Then a module of three connected excitatory cells is connected to the top three layers, with one of the cells in each layer. FIG. 5 illustrates non-hexagonal columns. A fourth of a complete n-RANC's outputs are not produced by hexagonal columns. This includes the n-RANCs for the outputs labeled $2^{n-1}-1$ and $2^{n-1}$. These n-RANCs are shown in FIG. 5A, 5B, 5C for n=4, 5, 6, respectively. The pattern evident in the diagrams shows the architecture for higher values of n. Other non-hexagonal n-RANCs are formed from these by the recursive definition of a complete n-RANC. The input cells that are not shown and the cells shown designated with an 'O' are not part of the networks because they are either inputs to the complete n-RANC or part of other n-RANCs within the complete n-RANC.

In various embodiments, the neurons in the figures may be translated into electronic components. Excitatory cells may be translated into two-input AND gates. Inhibitory cells may be translated into inverters. This makes the AND gates become AND NOT gates. The single square is a special-purpose cell that fires spontaneously and continuously. It may be translated into an AND NOT gate with a constantly high input from the power supply. As will be understood by one of skill in the art, such electronic components may be incorporated into circuits in a straightforward manner to provide circuits that emulate a portion of a brain's neural network.

Figure 6:
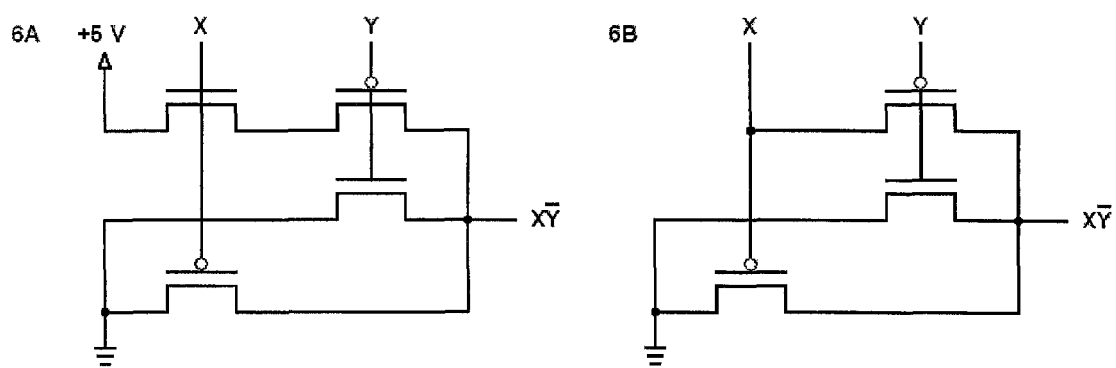
FIG. 6 illustrates two exemplary circuit diagrams that may be used to implement logical AND NOT gates.
Figure 7:
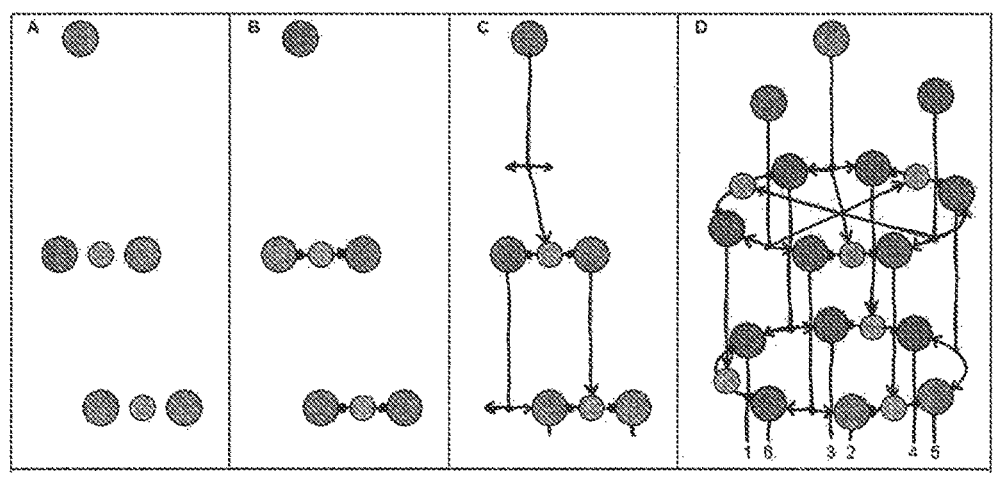
FIG. 7 illustrates 4 levels of modular architecture that may be used to construct logic circuits of various embodiments.

FIG. 6 illustrates two exemplary circuit diagrams that may be used to implement logical AND NOT gates. In these embodiments, nMOS and pMOS transistors are arranged as illustrated to provide the logical AND NOT gate. When the input variables X and Y have logical values 0 or 1, the output is the logic function X AND NOT Y. The illustrated circuit diagrams may be used to implement the described AND NOT gates for various embodiments of the n-RANCs and for other applications. Of course, one of skill in the art will readily recognize that various other circuits may be used to implement the described AND NOT gates. Similar circuits may be used to implement the above-described fuzzy logic embodiments.

Efficient Characteristics

Best Complete n-RANCs.

The number of possible ways of implementing any logic circuit that has more than two or three inputs is quite large. The different architectures vary widely in their efficient use of resources. This is true even under the restrictions of the Table 2 logic identities that define a RANC. For each n there exists at least one Complete n-RANC that minimizes the total cost of the number of cells, total connection length, and cellular packing density while retaining functionality. This network (or any one of the networks if there is more than one) will be called the Best Complete n-RANC (BC n-RANC).

Determining the exact architecture and spatial configuration of the BC n-RANC entails potential problems. Although the optimal arrangement of cells in each hexagonal column is fairly straightforward, the arrangement of columns and the arrangement of cells that produce input to the columns are complex. Because of this the complete optimal configuration is not determined here, but enough of its geometric properties are described and will be readily understood by one of skill in the art.

The three cost variables—number of cells, total connection length, and packing density—are not independent. A decrease in one cost can incur an increase in another. In addition, the relative costs of the variables are not known, e.g., the cost of one cell vs. the cost of a one centimeter connection. This means that if a reduction in one cost incurs an increase in another, it cannot be proven whether the tradeoff results in a net gain or loss. It also means there is no way to measure how close any particular network comes to minimizing the total cost.

Some tradeoffs have large asymmetries, where a slight increase in one cost can mean an obviously significant decrease in another cost. Although the cost benefit cannot be measured, it can be argued that the net change is fairly obviously a positive benefit because of the large asymmetry. In a few cases here, the trade affects the network's predictions about the brain. Each of these trades affects only one or two of the network's predictions, and in each case the network that is apparently more cost effective predicts more accurately. There are three such asymmetric trades here. In the next section it is shown that the number of cells is minimized at the cost of connection lengths that are slightly greater than the minimum. Then it is shown that greater functionality can be achieved at the cost of a few more cells than the minimum number. After the cells have been arranged to minimize total connection length for this network, it is shown that an increase in packing density in the upper layers can be gained at the cost of a possible slight increase in connection length.

FIG. 2A-C defines the cells and connections of the BC n-RANC for n=1, 2, 3. For n>3, the cells and connections of the BC n-RANC are defined recursively in terms of two BC (n−1)-RANCs, with some modifications described below. If the inputs to the BC n-RANC are $X_1, \ldots, X_n$, the inputs to one BC (n−1)-RANC are $\overline{X_n}X_1, \ldots, \overline{X_n}X_{n-1}$, and the inputs to the other are $X_n\overline{X_1}, \ldots, X_n\overline{X_{n-1}}$. This definition is illustrated in FIG. 2D, which shows a BC 4-RANC that is constructed from two BC 3-RANCs. (To avoid confusion it should be noted that although both RANCs and BC n-RANCs are defined recursively, a RANC is defined by the logic identities of Table 2, but a BC n-RANC is defined more narrowly.)

The recursive definition of a BC n-RANC produces a Complete n-RANC because conjoining a proposition (A) with each of the inputs (X and Y) to an AND NOT gate simply results in conjoining that proposition with the output ($X\overline{Y}$): By the neural AND NOT property, $(AX)\sim(AY)=(AX)(\overline{AY})$, and $(AX)(\overline{AY})=AX\overline{Y}$ by the algebra of classical logic. The propositions joined to the inputs are passed along through the entire (n−1)-RANCs and are joined to the outputs. The first (n−1)-RANC produces the outputs labeled 0 to $2^{n-1}-2$, and the second produces outputs $2^{n-1}+1$ to $2^n-1$.

Somewhat obvious modifications are required for the single n-RANCs that produce the outputs labeled 0 and $2^n-1$ so that they are produced according to the logic identities 3 and 4 in Table 2. These n-RANCs are shown on the left and right sides of FIG. 2A-D.

Modular Architecture

The BC n-RANCs have at least six levels of modular architecture, with each module consisting of a simple combination of a few repeated parts from the previous stage. FIG. 7A-D shows four of these levels: individual cells, identical three-cell parts in different layers, a three-layer module formed from these parts, and a hexagonal column made up of three such modules. Non-hexagonal n-RANCs for the outputs labeled $2^{n-1}-1$ and $2^{n-1}$ are also modular, as described previously in the recursive process for constructing them.

At the next n−3 levels, two BC (k−1)-RANCs are combined to form a BC k-RANC, k=4, . . . n, according to the recursive definition of BC n-RANCs. Finally, several BC n-RANCs can be combined to provide the logical structure for functional systems such as olfaction. This hierarchy of modular levels does not necessarily mean the assembly process must proceed sequentially in the order of levels, with the construction of one stage being completed before the next stage begins.

Number of Cells

Here is it shown that the number of cells in each BC n-RANC is nearly the minimum required for the $2^n$ outputs, and in a sense this number is optimal. Choosing a form that does not absolutely minimize the number of cells affects the prediction of the portion of inhibitory cells in the neocortex. Complete 1- and 2-RANCs are simple enough that optimal architectures are obvious (FIG. 2A, B). For n>2, it will first be shown how a Complete n-RANC can be constructed with slightly fewer cells than what has been defined as the BC n-RANC. Reasons are given for not defining the best one as the one with the fewest cells. With these minor exceptions, it can be demonstrated by exhaustion of all the possibilities that hexagonal columns minimize the number of cells required for a BC n-RANC. The proof is outlined for n=3, 4. The argument for higher values of n is similar to the proof for n=4.

Excitatory cells that excite only inhibitory cells could be omitted, and their inputs could be rerouted directly to the inhibitory cells. There are three such cells in the second lowest layer of each hexagonal column and one for each inhibitory cell in each non-hexagonal column. These excitatory cells are included in a BC n-RANC because their responses are m-RANC outputs, m<n, and the information contained in the responses might be usefully projected elsewhere in the brain. For example, the identification of one odorant may depend on a pattern of signals from a certain set of n olfactory receptor types, and identification of another odorant may depend on a pattern of signals from a proper subset of m of those receptor types. In that case, the m-RANC that produces the neural correlate of the second odorant could be a proper subset of the n-RANC that produces the neural correlate of the first.

Figure 8:
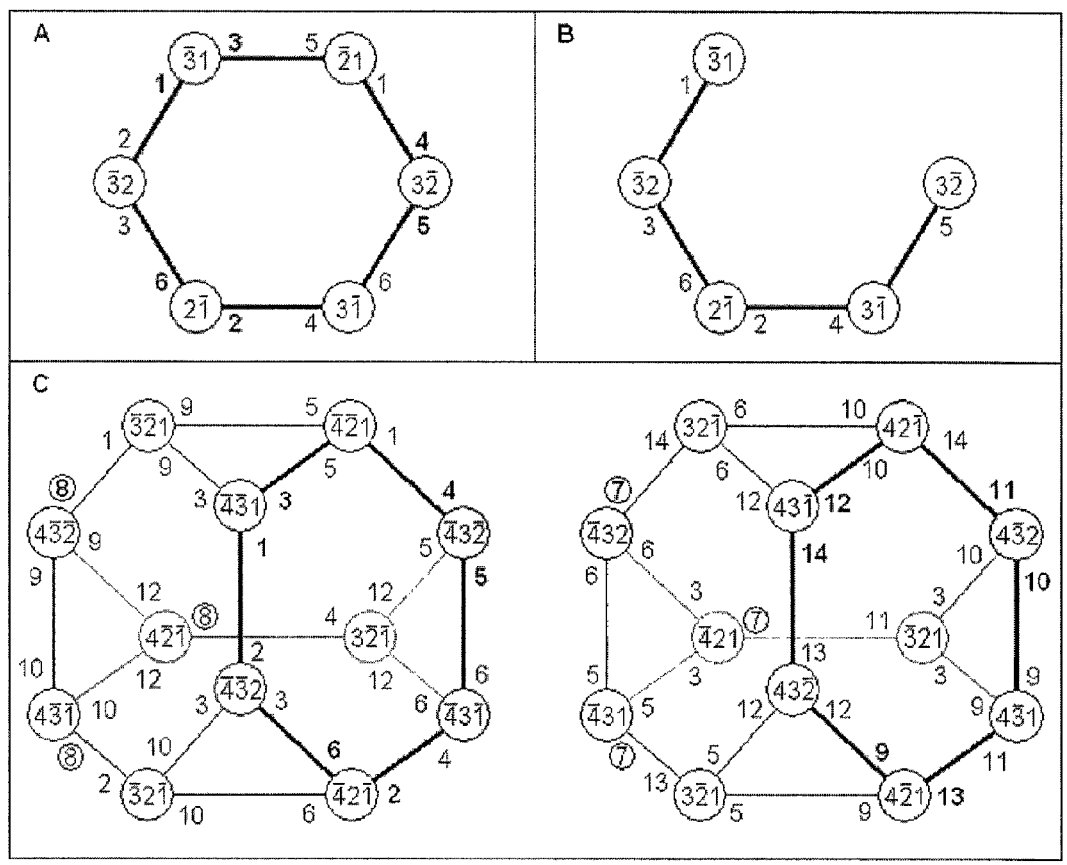
FIG. 8 illustrates graphs that may be used to show possible ways to produce final outputs of n-RANCs.

The minimum number of AND NOT gates required for a BC n-RANC is obtained from FIG. 8. A few elementary concepts in graph theory are required for the discussion of the FIG. 8 graphs (not to be confused with graphs of functions). Graphs consist of nodes and links, or edges, that connect some pairs of nodes to indicate that the nodes are related in some way. Nodes are usually depicted by circles, and edges by line segments connecting the circles. In a directed graph, the edges have a direction from one node to the other. The edges can be directed in one or both directions.

The directed graphs in FIG. 8 show all possible ways propositions can be paired according to equations 1 and 2 of Table 2 to produce the final outputs of 3 and 4-RANCs. Each node represents a proposition, and two nodes A and B are linked if they can form a conjunction $A\overline{B}$ according to either equation 1 or 2 of Table 2. The graphs are directed because each linked pair can form conjunctions in both directions, i.e., as $A\overline{B}$ and $B\overline{A}$. Along each edge, the label representing the conjunction $A\overline{B}$ is shown next to node A, and the label representing $B\overline{A}$ is next to B. For example, at the top of FIG. 8A the two nodes $\overline{3}1$ and $\overline{2}1$ are shown to be linked by a line segment. The edge label 3 next to node $\overline{3}1$ represents the conjunction $\{\overline{3}1\}\{\overline{21}\}=\overline{3}21$. The single 3-RANC that produces this conjunction in this way is shown in thick lines in FIG. 2C.

The hexagonal graph in FIG. 8A shows all possible ways of producing the final outputs of 3-RANCs according to equations 1 and 2 of Table 2. The edge labels show the pairings produce six distinct conjunctions, labeled 1 through 6. As the graph shows, there are many possible ways to connect neurons represented by the nodes to produce the six outputs. All six can be produced efficiently in two different ways using just three cells corresponding to alternate nodes in the graph as excitatory input and cells corresponding to the other three nodes as inhibitory input to the six output cells. Of the two possibilities, the edge labels in boldface show the 3-RANC architectures as they are implemented in FIG. 2C. Both ways require the same number of cells and have identical architectures; the only difference is in which cells provide excitatory input and which provide inhibitory input to the output cells.

FIG. 8B shows that the six conjunctions can be produced with any one of the nodes removed from the hexagon in FIG. 8A. Although this design is a slightly more resource-efficient possibility and applies to all n-RANC hexagonal columns for n>2, it is not incorporated in the BC n-RANC because it only reduces the number of cells by one per hexagonal column, because the cell produces a conjunction that may be useful as described at the beginning of this section, and because removing the cell precludes the modular construction illustrated in FIG. 7. Except for the two possibilities of removing a few cells described here and above, it is clear from a simple check of the finite number of possibilities shown in FIG. 8A that the two equivalent alternatives discussed in the previous paragraph are the most efficient ways of constructing the six single 3-RANCs that can be constructed from equations 1 and 2 of Table 2. Except for the choice between two equivalent alternatives, this architecture uniquely determines all of the cells and connections of the six 3-RANCs.

The graph in FIG. 8C shows all possible ways of producing the final outputs of 4-RANCs according to equations 1 and 2 of Table 2. The graph consists of two disconnected pieces because equations 1 and 2 imply that linked nodes must have the same number of negated components. Nodes in the first piece have two negated components, and nodes in the second have one. The disconnected pieces show that some of the outputs must be produced with separate structures, at least at the last stage.

Each piece of the graph consists of four hexagons that share common edges and lie on the faces of a tetrahedron. As in FIG. 8A, the edge labels show that each hexagon produces six distinct conjunctions. Each hexagon in one piece has a complementary hexagon in the same position in the other piece so that the two hexagons produce 12 distinct conjunctions. For example, the two hexagons drawn in thick lines and their edge labels in boldface show how the 12 outputs represented by the labels are produced in FIG. 2D.

The edge labels show that the outputs that are powers of two (1, 2, 4, 8) can be produced only by the first piece of the graph. Their complements (14, 13, 11, 7) can be produced only by the second piece. The edge labels on the first piece's hexagon in thick lines show that three of the outputs that are powers of two (1, 2, 4) can be produced in two different ways using three alternate cells as excitatory input and the other three as inhibitory input. A check of all the links in the first piece shows this is the fewest cells that can produce the three outputs (except, of course, for the possibility of one less cell as shown in FIG. 8B). The hexagon's remaining outputs (3, 5, 6) can be produced with just three more cells. One of the two possible ways of forming this network is illustrated by the first column in FIG. 2D. All three occurrences of the edge label 8 are circled in FIG. 8C. They are next to the only three nodes that are not connected by one link to the hexagon in thick lines. This means none of the nodes in the hexagon can be used to produce output 8. This output must be produced by a separate structure, at least in the final stage.

The same argument holds for every hexagon in FIG. 8C. Of the four outputs that can be produced only by the piece in which the hexagon lies, each hexagon can produce three with the fewest possible cells, and three more outputs with just three more cells. The fourth output must be produced by a separate structure. This argument shows that two complementary hexagons produce 12 distinct 4-RANCs with the fewest cells. The two remaining 4-RANCs that can be produced according to equations 1 and 2 of Table 2 must be produced with separate structures. Any complementary pair would work as well as another and their n-RANCs have identical architectures, but the hexagons in thick lines were chosen for FIG. 2D because the node names match the simplest possible recursive definition of BC n-RANCs.

The single n-RANC architecture with the minimum number of AND NOT gates for each output that must be produced by a separate structure is shown in the non-hexagonal columns in FIG. 5. The minimum number of AND NOT gates that provide input to both the hexagonal and non-hexagonal columns is given by the recursive definition of BC n-RANCs and is illustrated in FIG. 2D.

Total Connection Length and Cellular Packing Density

Connection length and cellular packing density will be considered together because both are related to the geometric arrangement of cells. Stains of the neocortex show the bodies of most neighboring neurons are separated by several times the diameter of a cell body. The efficiency of a network's connections and packing can be demonstrated, at least approximately, by placing cell bodies in non-overlapping spheres whose diameters are determined by the constraints of the necessary separations. Although the spheres containing the cells are imaginary, the back hemispheres are made to appear opaque in FIG. 9 so that the three-dimensional aspects of the diagrams are apparent. The basic assumptions in considering optimal cellular arrangements are that 1) the length of a connection between two cells is determined by the distance between the spheres containing them (so that the length is minimized when the spheres are adjacent), and 2) cellular packing density is determined by the packing density of the spheres containing them (so that cellular packing density is maximized when the packing density of their spheres is maximized).

Connection lengths can be minimized by collapsing the exploded views in FIG. 2 along the lines of connection. This determines the minimum-connection-length spatial arrangement of cells. (Complex connections and the order in which connections are contracted can affect the resulting configuration, but these are not problems for the rather simple connections in BC n-RANCs.) Brain development is apparently consistent with this intuitive approach: Axon elasticity and active force-generating capability are believed to be major factors in the morphogenesis of the brain.

The various hexagonal columns have some differences in their cells and connections, but the basic argument for the optimal arrangement can be illustrated by a typical column as represented by the first column in FIG. 2D. To show a column from a more general BC n-RANC, the number of inputs is assumed to be n=7 for FIG. 9. This figure shows part of a BC 7-RANC that produces outputs 1-6. Top views of the layers are shown in A, and the front and side views are in B and C, respectively. Several of the upper-layer cells, including cells in the single 7-RANC for output 0, are shown as the top two cellular layers in FIG. 9. The reason the cells are placed in two layers will be discussed later.

Figure 9:
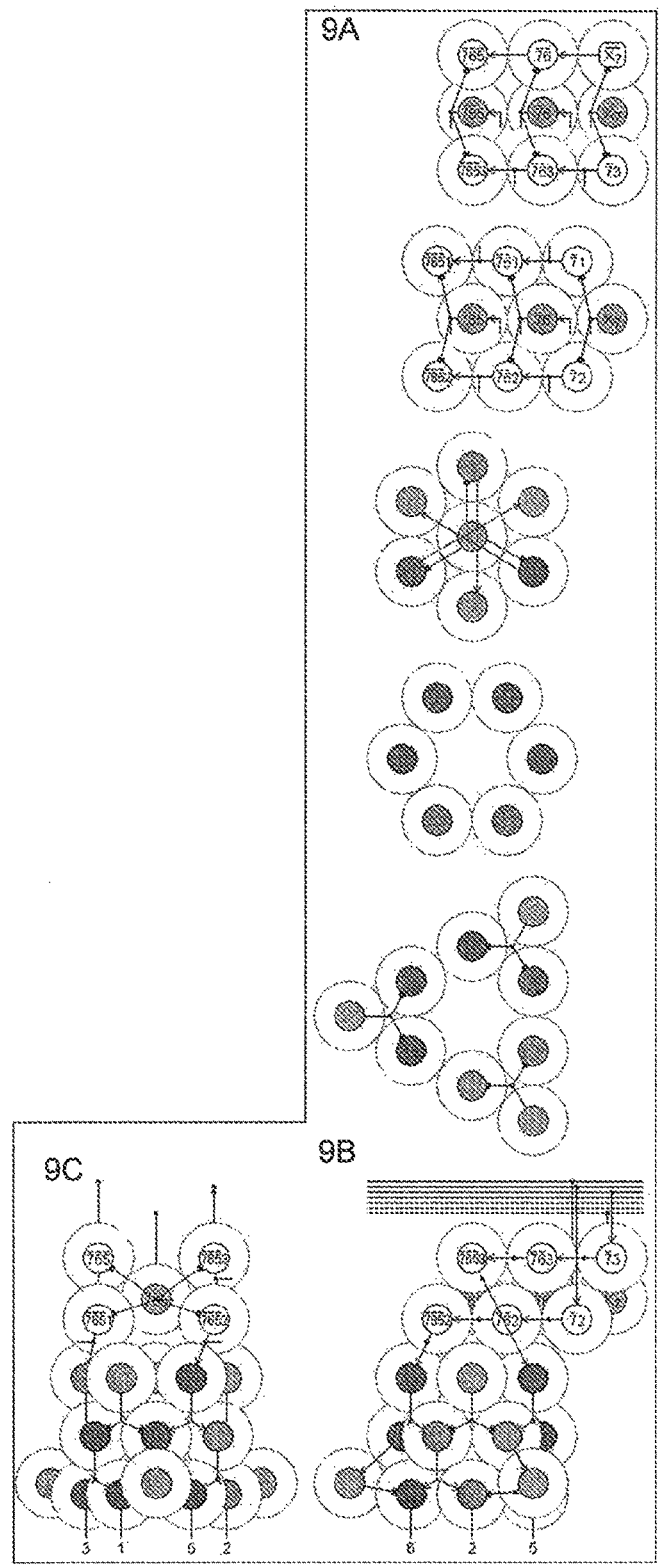
FIG. 9 illustrates 3-D packing of circuit components according to an embodiment.

To improve packing density in the lower three layers without affecting connection length, the three inhibitory cells in the second lowest layer of FIG. 2D have been moved to the third lowest layer in FIG. 9. Packing density could be improved somewhat more by moving two of the three inhibitory cells in the lowest layer to the centers of the lower two layers. This would increase connection length slightly. None of these choices affects the conclusions in this article. The absolute optimal configuration may not have been found in FIG. 9, but the main conclusion is that the optimal configuration for the lower cells is a hexagonal column consisting of three layers. Of the 63 connections in this structure, all are between cells in adjacent spheres except for three connections in the third lowest layer (FIG. 9A) and one connection from the top layer to the third lowest layer (FIG. 9B).

To minimize total connection length from the upper two layers to the columns, columns are clustered in a regular grid of equilateral triangles. The columns are approximately right circular cylinders, and a regular grid of equilateral triangles is the densest packing configuration for right circular cylinders on a plane.

Finding the densest configuration for packing congruent spheres in three-dimensional Euclidean space was until recently the oldest and most famous unsolved problem in discrete geometry. Attempting to discover the properties of matter in terms of atoms, Johannes Kepler speculated that the densest configuration is the common method of stacking cannonballs. Technically called a face-centered cubic lattice, this is the ordinary pyramidal stack seen today in the fruit sections of grocery stores. The density of this arrangement is $\pi/\sqrt{18}\approx 0.74$. The spheres in the upper two layers of FIG. 9 illustrate the optimal pattern, although some of the spheres needed to achieve the maximum density are missing. In a computer-assisted inspection of some 5,000 equivalence classes of possibilities, Kepler's Conjecture was finally found to be correct, along with other equally dense arrangements.

The minimum-connection-length columns determined by RANC connectivity do not achieve this optimum packing density, but they are still fairly dense. Packing density is normally computed under the assumption that a packing pattern is repeated without any boundary. For an arrangement of a small number of spheres, the space containing them is not clear. This makes comparing the density of a typical three-layer column with the optimum density problematical. A lower bound on the density can be computed using the smallest circular cylinder that contains the column. This gives a density of about $14/27\approx 0.52$, a conservative lower bound since the cylinder contains a considerable amount of empty space around and above and below the column. Rearranging all the spheres of a BC n-RANC to attain the optimal "cannonball" packing would greatly increase the total connection length.

Number of Layers

Many of the non-hexagonal columns have no connections to other columns in the lower layers. All of the cells in these non-hexagonal columns could therefore be placed in the upper layers without affecting connection lengths within the columns, but the outputs' projections to subcortical regions would be lengthened. In the remaining discussions it will be assumed that the cells shown in the lowest three layers of FIG. 5 are placed in the lowest three layers of BC n-RANCs, and the rest are placed in the upper layers. This assumption will not appreciably affect the conclusions concerning BC n-RANCs.

Useful information about BC n-RANCs can be obtained from a few ratios, one of which is discussed immediately below. The ratios converge asymptotically as n increases. From the recursive definition of BC n-RANCs, close approximations of the limits can be found by numerical methods. The exact values of the limits are not obtained here because some of the limits are convergent series that can only be approximated. The given approximations are accurate at least to the number of digits they contain.

It was pointed out earlier that minimizing the total connection length places the cells that produce the input to three-layered hexagonal columns above the columns, but the resulting spatial arrangement of these upper-layer cells may or may not have dense packing. It will now be shown that two layers above the three lower layers are sufficient to contain the upper-layer cells for all n, and two layers are necessary if $n \geq 7$. Achieving this packing could mean a few connection lengths are not minimized, such as the connection from the top layer to the third layer in FIG. 9B. This asymmetric trade achieves dense packing of the upper-layer cells at the possible cost of a few slightly longer connections. Few, if any, connections are lengthened because only a few of the cells in the upper layers are connected to the lower three layers. The trade affects the BC n-RANCs' prediction of the number of cellular layers in the neocortex.

No additional cells can be packed into the lowest three layers of hexagonal columns when they are arranged as shown in FIG. 9. The number of additional layers required to contain the upper-layer cells is the ratio of the number of upper-layer cells to the number of cells that can be contained in a layer. The number of upper-layer cells is easily computed from the recursive definition of BC n-RANCs. Seven cells can be placed in each layer above each hexagonal column. For non-hexagonal columns the optimal arrangement of cells has not been considered because for a fairly wide range of possibilities the precise arrangement will not affect the conclusions found here. The diagrams in FIG. 5 suggest two cells can be placed in each layer above each column in the pair of columns shown in FIG. 5A, and three above the lower three layers of each column in FIG. 5B. For all higher values of n, the lower three layers are identical to the lower three layers of FIG. 5C, and four cells can apparently be placed in each layer above these columns.

The ratio of the number of upper-layer cells to the number of cells that can be contained in a layer increases with n. The ratio reaches 1.15 for n=7 and converges rapidly to about 1.60. That is, two layers in addition to the lower three are sufficient for all values of n, and two are necessary if $n\geq 7$. The assumptions of 2, 3, and 4 cells in each layer above each non-hexagonal column can be relaxed considerably. If the average number of cells per layer above each non-hexagonal column is any number between 2 and 6, the ratio determining the number of additional layers converges rapidly to a number between 1 and 2. If all non-hexagonal columns are eliminated, the result is unchanged. In this case, the ratio increases asymptotically to 1.25 and reaches 1.01 at n=7.

Although the ratio 1.60 (as well as 1.25) means two layers are considerably more than adequate to contain the upper-layer cells in a BC n-RANC, most or all of two layers may be filled for such reasons as redundant cells for error correction and reduced available space in the upper layers if some of a BC n-RANC's possible outputs are not needed. For example, if all of the outputs from one of the hexagonal columns are not needed, eliminating the entire three-layered column reduces the space available in the two layers above that column. Almost all of the upper-layer cells are still needed to produce input to the remaining columns.

Modified RANCs

The BC n-RANCs can be modified, simplified, or made more efficient as incomplete n-RANCs in several ways. For example, there may not have been selective pressure to obtain the information in all of the $2^n$ possible outputs. Eliminating some of the single n-RANCs would reduce the lower layers by a number of cells. The Relative Absorption Model of color vision (RAM) is a modified BC 3-RANC that receives input from three classes of retinal cones and generates neural correlates of the perceptions of red, green, blue, yellow, black, and white. It has six outputs instead of the eight outputs of a BC 3-RANC. The two missing outputs would convey purple and violet information, which is transmitted through the red and blue channels in the RAM. Psychophysical evidence shows that this information is transmitted through the red and blue channels rather than through two separate channels, possibly because there was never selective pressure for the ability to obtain the complete violet and purple information.

Non-hexagonal columns require more cells per output than hexagonal columns. Many non-hexagonal columns can be eliminated under fairly broad conditions. For example, of the 20 outputs that have three negated components in a BC 6-RANC, only $\overline{654}321$ (labeled 7) and its complement $654\overline{321}$ (56) are not produced by a hexagonal column. The input number labels are arbitrary, so if any one of the 20 outputs is not needed, it could be labeled 7 and could be eliminated. If more than one are not needed and any two of the unneeded outputs are complementary, those two could be labeled 7 and 56 and their columns could be eliminated. This would leave all of the remaining single 6-RANCs with three negated components in hexagonal columns.

The single n-RANC that produces the output labeled 0 is a non-hexagonal column that requires n+1 cells added to an otherwise Complete n-RANC. This is considerably more than the number of cells per output in hexagonal columns. The response 0 is positive when there is no input. Vision is apparently the only sensory system that produces a perception (black) with no stimulus. For other senses and other uses of RANCs, a response to no input may not be needed. That would eliminate the need for a spontaneously active neuron as well as the other n extra cells in this single n-RANC.

BC n-RANC Efficiency

The BC n-RANCs were defined to be the best of all Complete n-RANCs as measured by the sum of three key cost functions. This definition does not imply the three BC n-RANC costs are economical in comparison to anything besides other Complete n-RANCs. It turns out that BC n-RANCs are quite efficient, not only in the three cost functions that define them but in several other aspects as well.

Component Requirements.

The BC n-RANC component requirements per output are bounded regardless of the number of inputs. As before, the asymptotic limits of the ratio can be approximated by the recursive definition of BC n-RANCs. As n increases, the number of AND NOT gates per output in a BC n-RANC increases asymptotically to about 4.9. If all of the less efficient non-hexagonal columns are eliminated, three fourths of the outputs still remain and the number of AND NOT gates per output increases asymptotically to 2.5.

The BC n-RANCs can be constructed with electronic components to perform Boolean logic, and the component requirements can be compared with standard electronic Boolean logic arrays. For more than a few inputs, BC n-RANCs require far fewer components. A Boolean AND NOT gate can be constructed with four transistors. Since the number of AND NOT gates per output in a BC n-RANC is bounded at 4.9, a Boolean logic BC n-RANC can be constructed with fewer than 20 transistors per output regardless of the number of inputs. Boolean logic arrays in semiconductor electronics are normally constructed with NAND or NOR gates. A two-input NAND or NOR gate can be constructed with four transistors (the same as an AND NOT gate). In electronic logic arrays, however, conjunctions that have several inputs are normally constructed separately, unlike the n-RANCs that share many AND NOT gates in BC n-RANCs. This means that for standard electronic logic arrays, the component requirement per conjunction increases without bound as the number of inputs increases.

Connection Length.

It was shown that nearly all connections in a BC n-RANC are between adjacent cells. This is a fortuitous feature of BC n-RANCs because minimum-connection-length configurations do not in general imply short connections. This can be demonstrated with a simple counterexample. Consider a set of congruent spheres in three-dimensional space with each sphere connected to every other sphere, and with the spheres arranged in a minimum-connection-length configuration. Both the average connection length and the total connection length are unbounded, increasing functions of the number of spheres.

Packing Density.

It was shown with a conservative estimate that the packing density in hexagonal columns is more than two thirds of the maximum possible density. The fairly dense packing is largely a result of the hexagonal shape and nested layers of the columns as determined by the minimum-connection-length configuration. Like the short connections, dense packing is a fortuitous feature of BC n-RANCs because minimum-connection-length configurations do not in general imply high density. This can be demonstrated with a minor modification of the hexagonal column of FIG. 9. Consider an equilateral triangular cylinder. The cylinder walls are composed of congruent spheres arranged as a few layers of Kepler's optimal "cannonball" stack. Each sphere is connected to its adjacent neighbors, so the total connection length is zero. The triangular cylinder is the only minimum-connection-length configuration because any rearrangement of spheres, such as folding the walls, would change the optimal "cannonball" packing and therefore lengthen some of the connections. Keeping the size of the triangular cylinder fixed, walls composed of sufficiently small spheres can make the packing density of the cylinder arbitrarily close to zero.

Modular Architecture.

The BC n-RANCs' modular architecture is largely a result of the recursive definitions for RANCs and BC n-RANCs. Modular architecture greatly simplifies the assembly process.

Number of Component Types.

Only two types of components are required for a BC n-RANC. The first is a component that provides a spontaneous and continuous high output signal. Only one component of this type is needed. In the brain, a neuron that fires spontaneously and continuously can serve as this component. In electronic logic circuitry, this function can be provided by the power supply. The second component is an AND NOT gate that allows continuous as well as discrete input values and provides a response that is measure of the difference between the two input values.

Fuzzy Logic.

It was shown above that for more than a few inputs, BC n-RANCs composed of transistors perform Boolean logic with far fewer components than standard electronic logic arrays. For fuzzy logic, BC n-RANCs composed of fuzzy AND NOT gates are also much more efficient than standard electronic systems. By the properties of Table 1, a single neuron together with an inhibitory neuron provides a measure of the difference between the inputs in a single operation. Conventional computational systems that encode information in discrete zeros and ones would require many components and many operations to carry out this fuzzy AND NOT computation. In addition, by the RANC interval measure property, RANCs composed of fuzzy AND NOT gates perform fuzzy logic. Even if a fuzzy AND NOT gate were to be constructed with electronic components, connecting them to produce fuzzy logic has apparently not been demonstrated with any architecture other than RANCs.

Nonlinearities.

Nonlinearities in the AND NOT function do not have serious adverse effects on the system. An accurate measure of the input difference is not necessary to generate useful fuzzy logic since such logic deals with largely subjective assignments of truth values. Useful fuzzy logic follows from the RANC interval measure property because each RANC output increases as the length of the interval it measures increases. That is, a higher degree of truth in the conjunction is reflected in a higher degree of truth in the RANC's measure of the truth value.

Information.

In spite of possible nonlinearities in the AND NOT function, BC n-RANC outputs retain all of the information in the inputs.

Layers.

The BC n-RANCs have a limited number of layers. It was shown that five layers are sufficient for any n.

Connection Directions.

Since nearly all connections are either within layers or between adjacent layers and perpendicular to the layers, the architecture is conducive to a three-dimensional, layered construction. The simple connections greatly simplify the assembly process.

Computation Time.

Although the number of BC n-RANC outputs grows exponentially with the number of inputs ($2^n$ conjunctions of n propositions), computation time grows linearly. The total time required to compute all $2^n$ outputs is the time it takes for a signal to pass through n−1 AND NOT gates. This property follows by induction from the recursive definition of BC n-RANCs.

Two Fuzzy Truth Functions for X AND NOT Y

Figure 10:
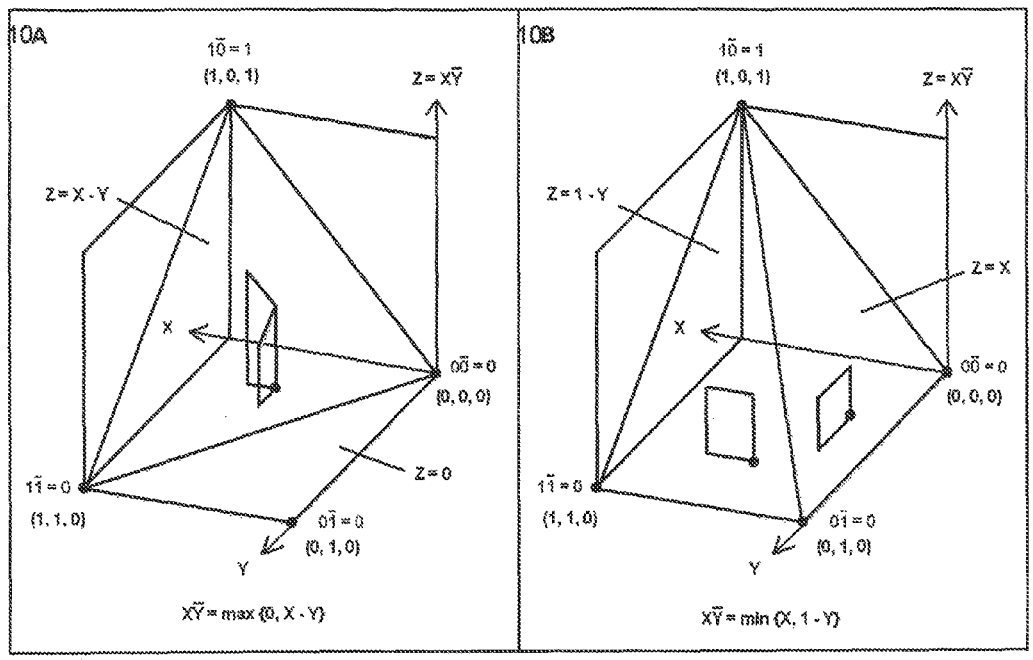
FIG. 10 illustrates graphs of two possibilities for fuzzy AND NOT functions.

A fuzzy logic truth function should agree with Boolean logic (the customary truth table) for binary values of the inputs, but infinitely many functions accomplish that. A linear function is the simplest possible truth function that is continuous. A fuzzy truth function for X AND NOT Y cannot be linear, however, because the four Boolean points (illustrated by large dots in FIG. 10) do not lie in a plane. There are two possibilities for fuzzy AND NOT functions that are linear on three of the four Boolean points, and both functions are continuous. The functions and their graphs are shown in FIG. 10. The function in A conveys how much greater X is than Y. This difference function is approximately the response of a neuron with excitatory input X and inhibitory input Y. (The neural response function is a measure of this difference, but because of nonlinearities in neural responses, the piece where X>Y is not exactly linear.)

The neural response illustrated in A agrees more closely with intuitive notions of truth values than the function in B. Where the truth function in A is positive, the function increases in X and decreases in Y (illustrated at the point shown in gray). This agrees with an intuitive notion of a truth value of X AND NOT Y. The second function remains constant in X where X+Y>1 and constant in Y where X+Y<1 (illustrated at the points in gray).

Fuzzy AND NOT Gate

Figure 11:
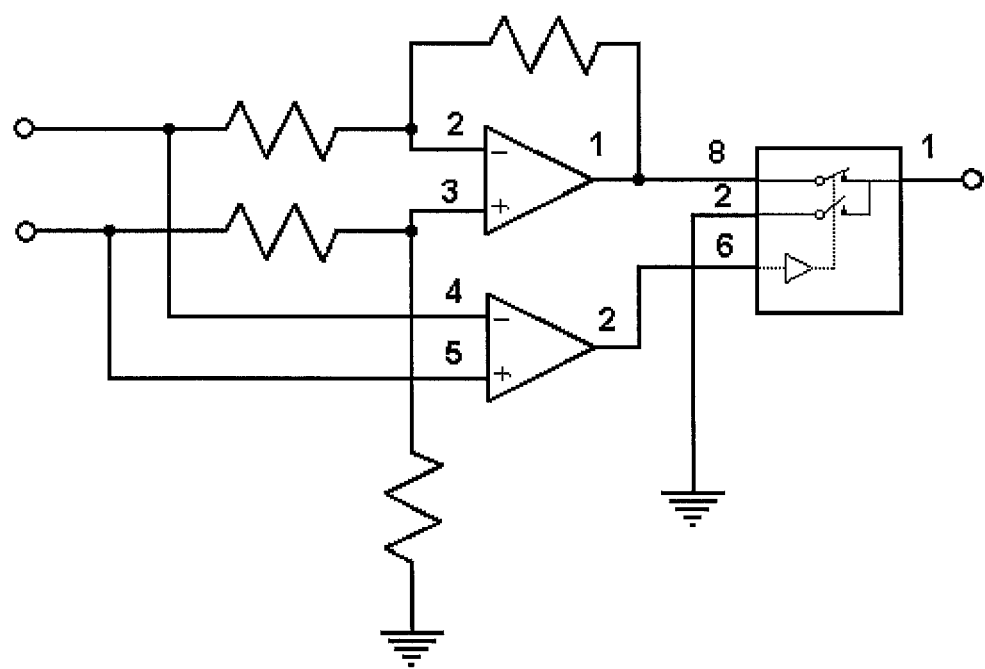
FIG. 11 illustrates a circuit diagram for an fuzzy AND NOT gate according to an embodiment.

FIG. 11 illustrates a fuzzy AND NOT gate according to an embodiment. The inputs X and Y are voltages representing any logical truth values in the interval [0, 1], and the output X AND NOT Y is the larger of 0 and X−Y. This output is piecewise linear. The device is implemented with an op amp whose output is enabled by a comparator that allows positive outputs and eliminates negative values.

Fuzzy Flip Flop and Fuzzy OR Gate

Figure 12:
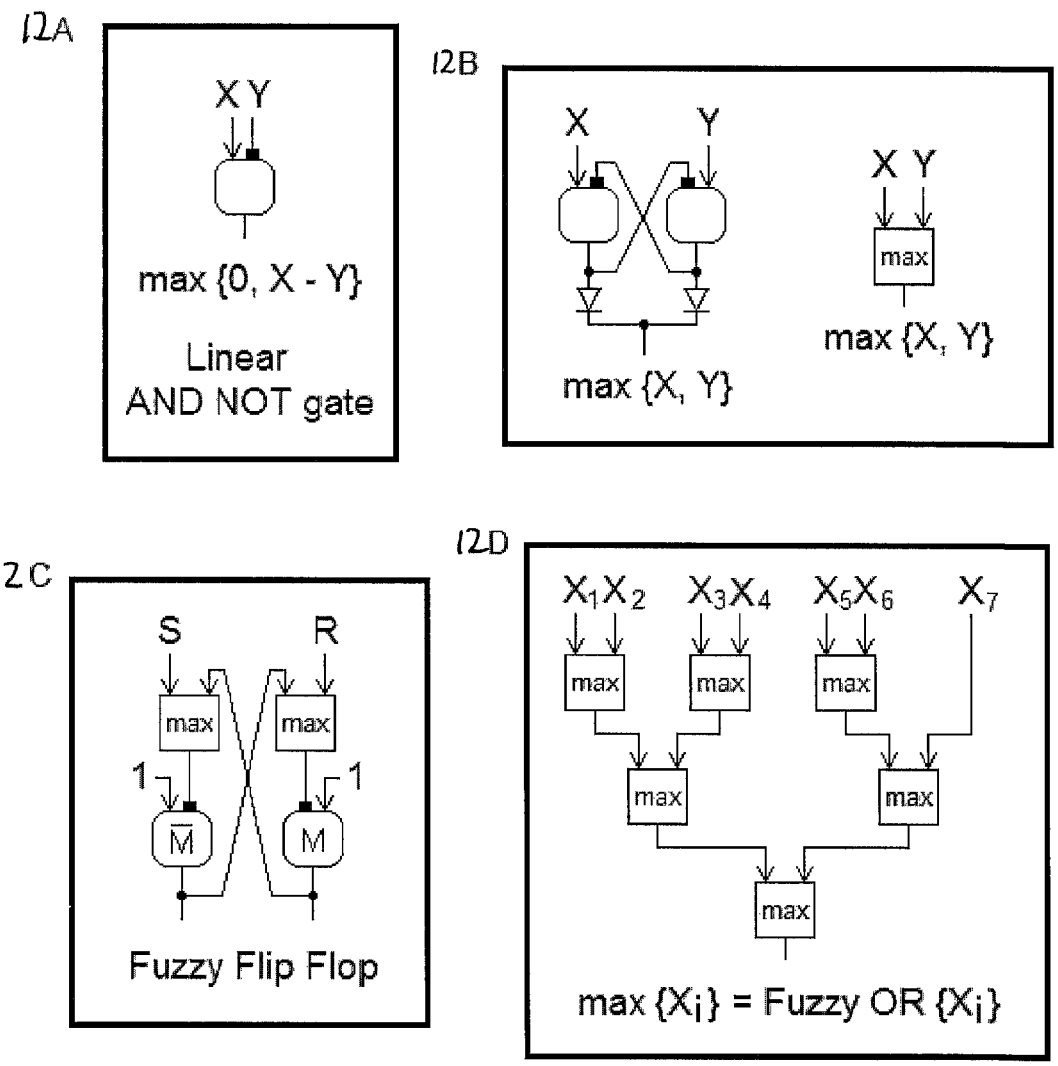
FIG. 12 illustrates several logical components that may be formed using fuzzy AND NOT gates according to an embodiment.

FIG. 12A shows a "black box" representation of the linear AND NOT gate of FIG. 11 according to an embodiment.

In FIG. 12B the output of each AND NOT gate is subtracted from the input to the other, so eventually the smaller of the two inputs X and Y is completely suppressed by the other and the output of the device is the larger of the two inputs. A "black box" representation is shown on the right of the figure.

FIG. 12C shows an active high fuzzy flip flop which stores any value in the interval [0, 1]. A high input R resets the memory bit M to 0. If S is also low, $\overline{M}$ is set to 1 which keeps M low and R can return to 0. Now any value of S in the interval [0, 1] sets the memory bit M to that value after two subtractions: First $\overline{M}=1-S$; then $M=1-(1-S)=S$. The output M then replaces the input S, which can return to 0. The outputs remain stable at $\overline{M}=1-S$ and $M=S$.

A fuzzy OR gate can be implemented with RANCs. The most common fuzzy definition of OR {Xi} is max {Xi}. (In this notation, OR {Xi} means X1 OR X2 OR . . . OR Xn, and max {Xi} means the largest of X1, . . . , Xn.) The most common fuzzy definition of NOT X is 1−X, which is also the RANC value of NOT X. Since the RANC fuzzy value of AND {NOT Xi} is a measure of 1−max {Xi} (equation 4 of Table 2), the RANC value of NOT [AND {NOT Xi}] is a measure of 1−[AND {NOT Xi}]=1−[1−max {Xi}]=max {Xi}=OR {Xi}. Note that this also agrees with DeMorgan's law: NOT [AND {NOT Xi}]=OR {Xi}.

Several max gates in FIG. 12D combine to give the maximum of any number of inputs, which is the most common definition of a fuzzy OR gate.

Those of skill will appreciate that the various illustrative logical blocks, circuits, and algorithm steps described in connection with the embodiments disclosed herein may be implemented as electronic hardware, computer software, or combinations of both. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Furthermore, the various illustrative logical circuits described in connection with the embodiments disclosed herein may be implemented or performed with fuzzy logic hardware or analog hardware in a stand alone manner, or in combination with other digital components as described above.

Reference is made to several publications of the inventor of the present application: (1) Yoder L. (2010) Explicit Logic Circuits Predict Local Properties of the Neocortex's Physiology and Anatomy, PLoS ONE 5(2): e9227. doi:10.1371/journal.pone.0009227; (2) Yoder L. (2005) Relative absorption model of color vision. Color Research and Application 30: 252-264; and (3) Yoder L. (2009) Explicit Logic Circuits Discriminate Neural States. PLoS ONE 4(1): e4154. doi: 10.1371/journal.pone.0004154; the entire disclosures of which are incorporated herein by reference.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A decoder/multiplexer logic circuit capable of performing Boolean and fuzzy logic on conjunctions for $2^n$ possible combinations of truth values of n propositions comprising:
   one or more AND NOT gates, each AND NOT gate configured to provide a measure of the difference between a first (X) and second (Y) input value, each in the interval [0,1], wherein the measure of the difference X−Y, is defined by:

1) when X=1 and Y=0, the measure of the difference is 1;
2) when X is less than or equal to Y, the measure of the difference is 0; and
3) when X is greater than Y, the measure of the difference is an increasing function of X and a decreasing function of Y.

2. The logic circuit of claim 1, wherein each AND NOT gate comprises an input for excitation and an input for inhibition.

3. The logic circuit of claim 1, wherein the inputs to the decoder correspond to outputs from retinal cones, and wherein each decoder output generates a neural correlate of color vision.

4. The logic circuit of claim 1, wherein the inputs to the decoder correspond to olfactory receptor outputs, and wherein the outputs of the decoder comprise signals to discriminate odors.

5. The logic circuit of claim 1, wherein each AND NOT gate comprises four transistors.

6. The logic circuit of claim 1, wherein each AND NOT gate comprises an X input and a Y input, the X input coupled to the gates of a first N-channel MOSFET transistor and a first P-channel MOSFET transistor, and the Y input coupled to the gates of a second P-channel MOSFET transistor and a second N-channel MOSFET transistor, wherein the drain of the first N-channel transistor is coupled to the source of the second P-channel transistor, the source of the first P-channel transistor is coupled to a source voltage, the source of each of the first P-channel and second N-channel transistors coupled to ground, and the drains of each of the first and second P-channel and second N-channel transistors are coupled to an output.

7. The logic circuit of claim 1, wherein each AND NOT gate comprises three transistors.

8. The logic circuit of claim 7, wherein each AND NOT gate comprises an X input and a Y input, the X input coupled to the gate of a first P-channel MOSFET transistor and a source of a second P-channel MOSFET transistor, and the Y input coupled to the gates of the second P-channel MOSFET transistor and a first N-channel MOSFET transistor, wherein the source of each of the first P-channel transistor and the first N-channel transistor is coupled to ground, and the drains of each of the first and second P-channel and first N-channel transistors are coupled to an output.

9. The logic circuit of claim 1, wherein each AND NOT gate comprises an X input and a Y input, the X input coupled to a first input of first and second operational amplifiers, and the Y input coupled to second inputs of first and second operational amplifiers, the output of the amplifiers summed to provide an output that is the larger of zero and the sum of X−Y.

10. The logic circuit of claim 9, comprising first and second AND NOT gates configured to form a MAX gate, the max gate comprising a first (X) input and a second (Y) input, wherein:
the first input to the first AND NOT gate is interconnected to the X input and the second input to the first AND NOT gate interconnected to the output of the second AND NOT gate,
the first input to the second AND NOT gate is interconnected to the output of the first AND NOT gate, and the second input to the second AND NOT gate is interconnected to the Y input,
wherein the outputs of the first and second AND NOT gates are inverted and summed thereby providing an output corresponding to the maximum value of the X and Y inputs.

11. The logic circuit of claim 10 further comprising a first and second MAX gate, and first and second memory bits configured as a flip flop circuit comprising a first (S) input and a second (R) input, wherein:
the first input to the first MAX gate is interconnected to the S input and the second input to the first MAX gate is interconnected to the output of the second memory bit;
the first input to the second MAX gate is interconnected to the output of the first memory bit and the second input to the second MAX gate is interconnected to the R input;
the output of the first MAX gate is inverted and interconnected to an input of the first memory bit, the first memory bit configured to output the difference between a logical one and the inverted output of the first MAX gate;
the output of the second MAX gate is inverted and interconnected to an input of the second memory bit, the second memory bit configured to output the difference between the inverted second MAX gate output and logical one, the output of the second memory bit is thereby configured to output the first (S) input until the second (R) input is a logical one.

12. The logic circuit of claim 10, further comprising a plurality of MAX gates and a plurality of inputs, the plurality of inputs interconnected to respective inputs of MAX gates, and the plurality of MAX gates interconnected to provide an output that corresponds to an input of the plurality of inputs having a maximum value.

13. The logic circuit of claim 1, comprising a plurality of AND NOT gates configured to receive a plurality of inputs and output the maximum value of the plurality of inputs, thereby functioning as a fuzzy OR gate.

14. A decoder/multiplexer logic circuit, with n inputs and $2^n$ outputs for any positive integer n, capable of performing Boolean and fuzzy logic comprising:
a plurality of AND NOT gates, each configured to provide a measure of the difference between a first (X) and second (Y) input value, each in the interval [0,1], wherein the measure of the difference X−Y is defined by:
1) when X=1 and Y=0, the measure of the difference is 1;
2) when X is less than or equal to Y, the measure of the difference is 0; and
3) when X is greater than Y, the measure of difference is an increasing function of X and a decreasing function of Y
the plurality of AND NOT gates configured to provide for each subset of input values an output that is a measure of the difference between a first number that is the minimun of the subset and a second number that is a maximum of the inputs not in the subset.

15. The logic circuit of claim 14, wherein each AND NOT gate comprises an input for excitation and an input for inhibition.

16. The logic circuit of claim 14, wherein one or more of the AND NOT gates comprises four transistors.

17. The logic circuit of claim 14, wherein one or more of the AND NOT gates comprises an X input coupled to the gates of a first N-channel MOSFET transistor and a first P-channel MOSFET transistor, and a Y input coupled to the gates of a second P-channel MOSFET transistor and a second N-channel MOSFET transistor, wherein the drain of the first N-channel transistor is coupled to the source of the second P-channel transistor, the source of the first P-channel transistor is coupled to a source voltage, the source of each of the first P-channel and second N-channel transistors coupled to ground, and the drains of each of the first and second P-channel and second N-channel transistors are coupled to an output.

18. The logic circuit of claim 14, wherein one or more of the AND NOT gates comprises three transistors.

19. The logic circuit of claim 18, wherein one or more of the AND NOT gates comprises an X input coupled to the gate of a first P-channel MOSFET transistor and a source of a second P-channel MOSFET transistor, and a Y input coupled to the gates of the second P-channel MOSFET transistor and a first N-channel MOSFET transistor, wherein the source of each of the first P-channel transistor and the first N-channel transistor is coupled to ground, and the drains of each of the first and second P-channel and first N-channel transistors are coupled to an output.

20. The logic circuit of claim 14, wherein one or more of the AND NOT gates comprises an X input coupled to a first input of first and second operational amplifiers, and a Y input coupled to second inputs of first and second operational amplifiers, the output of the amplifiers summed to provide an output that is the larger of zero and the sum of X−Y.

\* \* \* \* \*